(12) United States Patent
Sugawara

(10) Patent No.: US 8,786,024 B2
(45) Date of Patent: Jul. 22, 2014

(54) SEMICONDUCTOR DEVICE COMPRISING BIPOLAR AND UNIPOLAR TRANSISTORS INCLUDING A CONCAVE AND CONVEX PORTION

(75) Inventor: Yoshitaka Sugawara, Hitachi (JP)

(73) Assignees: Yoshitaka Sugawara, Hitachi-shi (JP); Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/583,817

(22) PCT Filed: Apr. 15, 2011

(86) PCT No.: PCT/JP2011/059421
§ 371 (c)(1),
(2), (4) Date: Sep. 10, 2012

(87) PCT Pub. No.: WO2011/129443
PCT Pub. Date: Oct. 20, 2011

(65) Prior Publication Data
US 2013/0001703 A1    Jan. 3, 2013

(30) Foreign Application Priority Data

Apr. 15, 2010    (JP) ................. 2010-106731

(51) Int. Cl.
*H01L 29/80*    (2006.01)
*H01L 21/70*    (2006.01)
*H01L 29/66*    (2006.01)
*H01L 23/62*    (2006.01)
*H01L 27/06*    (2006.01)
*H01L 29/02*    (2006.01)
*H01L 27/02*    (2006.01)
*H01L 29/739*   (2006.01)
*H01L 29/06*    (2006.01)
*H01L 29/16*    (2006.01)
*H01L 29/45*    (2006.01)

(52) U.S. Cl.
CPC ......... *H01L 29/0657* (2013.01); *H01L 29/0615* (2013.01); *H01L 29/0696* (2013.01); *H01L 29/739* (2013.01); *H01L 29/0638* (2013.01); *H01L 29/7397* (2013.01); *H01L 29/1608* (2013.01); *H01L 29/45* (2013.01); *H01L 29/0661* (2013.01)
USPC ........... 257/378; 257/256; 257/273; 257/329; 257/335; 257/361; 257/362; 257/370; 257/511; 257/517; 257/539; 257/552; 257/557; 257/575

(58) Field of Classification Search
None
See application file for complete search history.

(56) References Cited

U.S. PATENT DOCUMENTS

| 6,054,748 A * | 4/2000 | Tsukuda et al. ............. 257/496 |
| 7,821,014 B2 | 10/2010 | Yonezawa et al. |
| 2005/0156283 A1 | 7/2005 | Tokuda et al. |
| 2005/0258493 A1 * | 11/2005 | Aono et al. .................. 257/370 |
| 2007/0170436 A1 | 7/2007 | Sugawara |
| 2007/0298578 A1 * | 12/2007 | Khater et al. ................ 438/322 |
| 2009/0114946 A1 * | 5/2009 | Ueno ............................. 257/137 |

FOREIGN PATENT DOCUMENTS

| JP | 4-261064 A | 9/1992 |
| JP | 7-153951 A | 6/1995 |
| JP | 10-321877 A | 12/1998 |
| JP | 2004/066394 A1 | 8/2004 |
| JP | 2005-223220 A | 8/2005 |
| JP | 2005-268731 A | 9/2005 |
| JP | 2006-156658 A | 6/2006 |
| JP | 2009-158922 A | 7/2009 |
| JP | 2010-034172 A | 2/2010 |

OTHER PUBLICATIONS

Asano, K. et al., "A Novel Ultra High Voltage 4H-SiC Bipolar Device: MAGBT", Proceedings of 2004 International Symposium on Power Semiconductor Devices & ICs, 2004, pp. 305-308; cited in specification.

Das, Mrinal K., et al. "A 13kV 4H-SiC n-channel IGBT with Low Rdiff,on and Fast Switching", Materials Science Forum vols. 600-603, 2009, pp. 1183-1186; cited in specification.

(56) References Cited

OTHER PUBLICATIONS

Sugawara, Y. et al., "12.7 kV Ultra High Voltage SiC Commutated Gate Turn-off Thyristor: SICGT", Proceedings of 2004 International Symposium on Power Semiconductor Devices & ICs, 2004, pp. 365-398; cited in specification.
Sugawara, Y. et al., "SiC Power Devices for High-Power Conversion", The Japan Society of Applied Physics, 2001, pp. 530-535, vol. 7 No. 5; cited in specification.
International Search Report of PCT/JP2011/059421, mailing date Jul. 19, 2011.
Notification of Transmittal of Translation of the International Preliminary Report on Patentability (Forms PCT/ IB/326) of International Application No. PCT/JP2011/059421 mailed Oct. 26, 2012 with Forms PCT/IB/373, PCT/IB/338 and PCT/ISA/237.
Japanese Office Action dated Feb. 18, 2014, issued in corresponding Japanese application No. 2012-510718, w/Partial English Translation (6 pages).

* cited by examiner

*Primary Examiner* — Alexander Sofocleous
*Assistant Examiner* — Jay C Chang

(74) *Attorney, Agent, or Firm* — Westerman, Hattori, Daniels & Adrian, LLP

(57) ABSTRACT

A combined switching device includes a MOSFET disposed in a MOSFET area and IGBTs disposed in IGBT areas of a SiC substrate. The MOSFET and the IGBTs have gate electrodes respectively connected, a source electrode and emitter electrodes respectively connected, and a drain electrode and a collector electrode respectively connected. The MOSFET and the IGBTs are disposed with a common n-buffer layer. A top surface element structure of the MOSFET and top surface element structures of the IGBTs are disposed on the first principal surface side of the SiC substrate. Concave portions and convex portions are disposed on the second principal surface side of the SiC substrate. The MOSFET is disposed at a position corresponding to the convex portion of the SiC substrate. The IGBTs are disposed at positions corresponding to the concave portions of the SiC substrate.

15 Claims, 11 Drawing Sheets

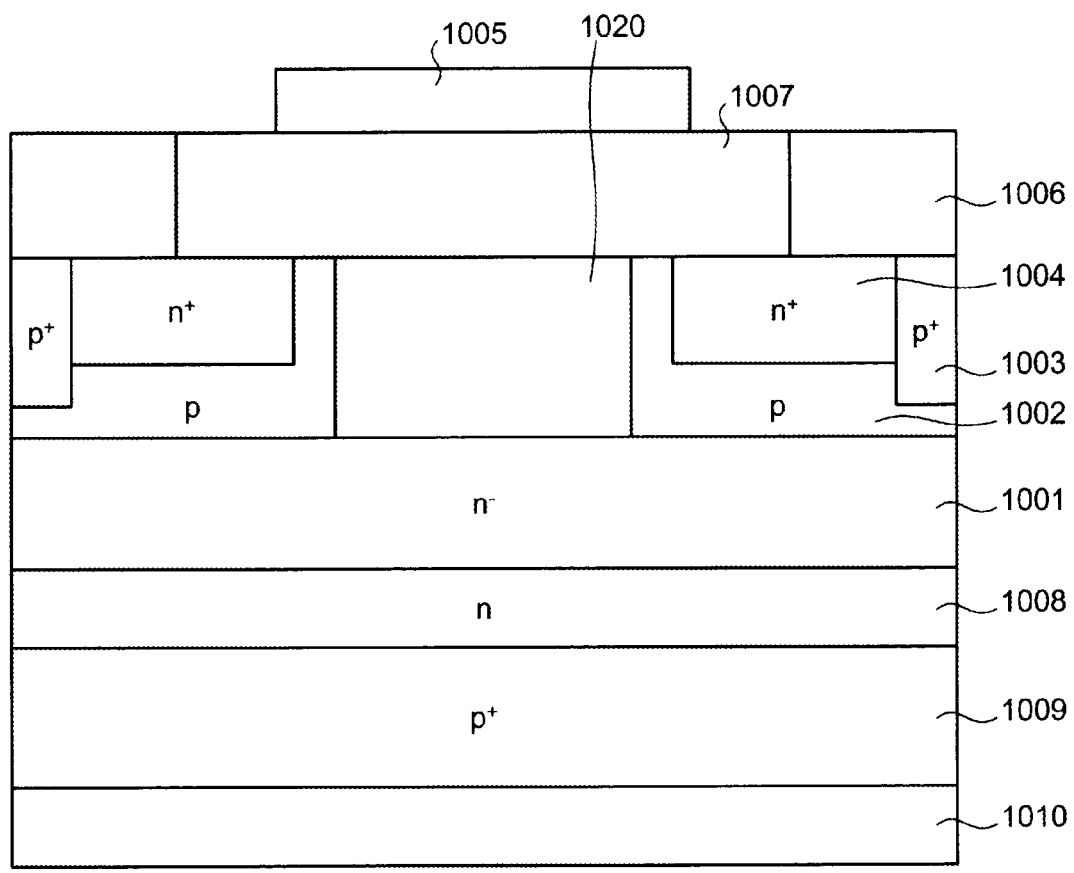

SEMICONDUCTOR DEVICE COMPRISING BIPOLAR AND UNIPOLAR TRANSISTORS INCLUDING A CONCAVE AND CONVEX PORTION

TECHNICAL FIELD

The present invention related to a semiconductor device.

BACKGROUND ART

Semiconductor material (wide-gap semiconductor material) such as silicon carbide (SiC) having a band gap wider than silicon recently attracts attention as semiconductor material suitable for semiconductor devices used under environments requiring a high breakdown voltage. For example, SiC has excellent characteristics of breakdown electric field strength, which is about ten times higher than silicon (Si), and can realize higher backward voltage rejection characteristics.

A pn junction diode, i.e., a bipolar type semiconductor device, fabricated by using SiC as a semiconductor material (hereinafter, "made of SiC") can realize far better performance than a pn junction diode fabricated by using Si as a semiconductor material (hereinafter, "made of Si").

For example, compared to a pn diode made of Si, if a pn junction diode made of SiC has a 10-kV or higher breakdown voltage, the pn junction diode has a forward voltage less than or equal to about ¼, operates at higher speed since the reverse recovery time corresponding to the speed at the time of turn-off is less than or equal to about ⅒, and can reduce electric power loss to about ⅙ or less of the pn junction diode made of Si. Therefore, the pn diode made of SiC is expected to significantly contribute to energy saving (see, e.g., Non-Patent Literature 1).

A switching device realizing a higher breakdown voltage by using SiC as a semiconductor material (hereinafter, "high-voltage semiconductor switching device") can also significantly reduce electric power loss as compared to a switching device made of Si. Therefore, the high-voltage semiconductor switching device made of SiC is also expected to significantly contribute to energy saving.

FIG. 11 is a cross-sectional view of a conventional switching device. Bipolar transistors made of wide-gap semiconductor materials such as insulated gate bipolar transistor (SiC-IGBT) depicted in FIG. 11 and SiC-MOS accumulated channel gate bipolar transistor (MAGBT) are developed as switching devices made of SiC and the characteristics thereof are disclosed (see, e.g., Patent Document 1 and Non-Patent Literatures 2 to 4).

In the SiC-IGBT depicted in FIG. 11, reference numerals 1001 to 1010 and 1020 denote an n⁻-drift layer, a p-well layer, a p⁺-contact layer, an n⁺-emitter layer, a gate electrode, an emitter electrode, a gate insulating film, an n-buffer layer, a p⁺-collector layer, and a collector electrode, a Junction Field-Effect Transistor (JFET) area, respectively.

However, currently, Si-IGBT made of Si is often used as a switching device required to have a high breakdown voltage because of supply of large electric power and medium electric power and the Si-IGBT made of Si is frequently used in various application fields.

The Si-IGBT is realized and made into a product to the extent of 6-kV class breakdown voltages, for example. On the other hand, the Si-IGBT having a breakdown voltage greater than or equal to a 6-kV class leads to deterioration in another characteristic such as reduction in electric power loss and is difficult to satisfy both other characteristics and high breakdown voltage. Therefore, the Si-IGBT realizing a breakdown voltage greater than or equal to a 6-kV class is not yet made into a product.

For example, the SiC-IGBT as depicted in FIG. 11 realizes a high breakdown voltage of a 13-kV class, which is difficult to realize with the Si-IGBT, and realizes the usage under a high-temperature environment of 200 degrees C., which is difficult to realize with the Si-IGBT. The SiC-IGBT has lower on-resistance in an energized state as compared to a unipolar type switching device such as SiC-MOSFET having a 10 kV class breakdown voltage (see, e.g., Non-Patent Literature 2).

For example, while the on-resistance per unit area of the SiC-MOSFET having a 10-kV class breakdown voltage is about 100 mΩ-cm², a SiC-IGBT having a 13-kV class breakdown voltage realizes a considerably lower on-resistance per unit area of 22 mΩ-cm². SiC-IGBT operates at extremely high speed. For example, a turn-off time of the SiC-IGBT is about 150 ns and the off-operation of the SiC-IGBT is reduced to ⅒ or less as compared to the Si-IGBT having a 6-kV class breakdown voltage already made into a product.

Patent Document 1: Japanese Laid-Open Patent Publication No. 2005-223220

Non-Patent Literature 1: Sugawara, Yoshitaka, "SiC power devices for large electric power conversion", Oyo Buturi, The Japan Society of Applied Physics, 2001, Vol. 70, No. 5, pp. 530-535

Non-Patent Literature 2: Das, M. K., et al, "A 13 kv 4H—SiC n-channel IGBT with Low Rdiff, on and Fast Switching" (Switzerland), Material Science Forum, 2009, Vols. 600 to 603, pp. 1183-1186

Non-Patent Literature 3: Asano, K., et al, "A Novel Ultra High Voltage 4H—SiC Bipolar Device: MAGBT", Proceedings of 19th International Symposium on Power Semiconductor Devices and ICs, 2004, pp. 305-308

Non-Patent Literature 4: Sugawara, Y., et al, "12.7 kV Ultra High Voltage SiC Commutated Gate Turn-off Thyristor: SICGT", Proceedings of 19th International Symposium on Power Semiconductor Devices and ICs, 2004, pp. 365-368

DISCLOSURE OF INVENTION

Problem to be Solved by the Invention

However, as a result of extensive research, the inventors newly discovered that the following problems occur. It is not mentioned that the configurations of switching devices described in Non-Patent Literatures 2 to 4 described above have various problems in realizing the intrinsic performance of a switching device made of wide-gap semiconductor material (hereinafter, wide-gap semiconductor switching device) due to a limitation based on the characteristics specific to the wide-gap semiconductor material and a limitation attributed to processing accuracy of a semiconductor substrate made of the wide-gap semiconductor material. The problems occurring at the time of fabrication of the wide-gap semiconductor switching device are particularly serious in realizing a high-performance, highly-reliable wide-gap semiconductor switching device.

For example, a wide-gap semiconductor switching device such as the SiC-IGBT depicted in FIG. 11 has a remarkably large built-in voltage before an on-current starts flowing when a voltage is applied in the forward direction, because of a wide band gap, which is characteristic of the wide-gap semiconductor material. For example, while the built-in voltage of Si-IGBT is about 0.7 V, the built-in voltage of SiC-IGBT is about 2.7 V. In other words, even if a voltage is applied in the forward direction, SiC-IGBT is not energized until the applied voltage reaches about 2.7 V and, therefore, a first problem occurs that electric power loss increases.

It is difficult to acquire p-type single crystals having a high impurity concentration greater than or equal to $1 \times 10^{20}$ cm$^{-3}$ by adding a p-type impurity to grow p-type single crystals without considerable deterioration in the crystal quality of the p-type single crystals of SiC. Therefore, a semiconductor substrate having p-type single crystals grown by using SiC as semiconductor material (hereinafter, p-type SiC support substrate) has a material-specific problem that resistivity cannot be reduced. For example, if the SiC-IGBT depicted in FIG. 11 is fabricated by using a p-type SiC support substrate, when the p$^+$-collector layer 1009 consisting of a p-type SiC support substrate is made thicker, the internal resistance of the p$^+$-collector layer 1009 becomes higher and the electric power loss of the SiC-IGBT increases. Therefore, the p$^+$-collector layer 1009 must be thinned as much as possible to, for example, about 10 μm.

However, if the p$^+$-collector layer 1009 is thinned, the overall thickness of the SiC-IGBT is reduced. For example, in the case of the SiC-IGBT having a 13-kV class breakdown voltage described in Non-Patent Document 2 described above, the overall thickness of the SiC-IGBT is 150 to 200 μm or less. If the overall thickness of the SiC-IGBT is reduced, a wafer using SiC as a semiconductor material for forming the SiC-IGBT (hereinafter, SiC wafer) is thinly processed; however, a thinly processed SiC wafer having a flat shape turns to a convexly warped state or a concavely warped state when each of various processes is executed for forming the SiC-IGBT, and is deformed to a complex curved shape. Since various heat treatments performed for the wide-gap semiconductor material must generally be performed at high temperatures, the curvature of the SiC wafer is further promoted and increased.

If the SiC wafer is curved, problems occur such as difficulty in formation of fine patterns with etching etc., on a surface or a surface layer of the SiC wafer, the destruction of the SiC wafer due to an external force (hereinafter, mechanical stress) and heat (hereinafter, heat stress) applied to the SiC wafer by various processing devices, and the occurrence of a multiplicity of various defects in the SiC wafer if not destroyed. The defects generated in the SiC wafer lead to increases in leak current and increases in internal noise, causing considerable deterioration in the performance of the SiC-IGBT.

As the curvature of the SiC wafer increases, the formation of SiC-IGBT fulfilling the intrinsic high performance of the wide-gap semiconductor material becomes impossible. Even if the SiC-IGBT fulfilling the intrinsic high performance of the wide-gap semiconductor material can be formed, a second problem occurs that an extremely low yield considerably deteriorates economic efficiency.

To prevent the internal resistance of the p$^+$-collector layer 1009 of the SiC-IGBT from increasing, the p$^+$-collector layer 1009 must be thinly formed as described above. Therefore, at the time of die bonding when the SiC-IGBT is mounted on a package, mechanical stress may be applied to the SiC-IGBT due to a scrub operation of melting and adjusting solder. When the SiC-IGBT is mounted and when the SiC-IGBT is operated after mounting, heat stress may be applied to the SiC-IGBT due to a difference in heat expansion coefficient between the wide-gap semiconductor material and a material constituting the package.

If mechanical stress or heat stress is applied to the SiC-IGBT, many defects occur in the p$^+$-collector layer 1009 of the SiC-IGBT. The defects occurring in the p$^+$-collector layer 1009 easily reach the junction between the p$^+$-collector layer 1009 and the n-buffer layer 1008 and increase the leak current. If the leak current is increased, a third problem occurs that the performance of the SiC-IGBT deteriorates.

The mechanical stress and the heat stress due to the curvature of the SiC wafer and the thinning of the p$^+$-collector layer 1009 of the SiC-IGBT generate a multiplicity of various defects in the layers of the SiC-IGBT made of the wide-gap semiconductor material. Among these defects, a stacking fault is expanded in size because atoms at lattice points are moved by collision energy when injected minority carriers collide with crystal lattice points.

The property of expansion in size of the stacking fault is a property specific to the wide-gap semiconductor material. The stacking fault traps, recombines, and extinguishes the minority carriers in the wide-gap semiconductor material without contributing to energization. This increases the internal resistance of the SiC-IGBT. Therefore, a bipolar type semiconductor device such as the SiC-IGBT fabricated from the wide-gap semiconductor material has the stacking fault increased due to the minority carriers injected while the device is operated and energized, and the internal resistance is increased. As a result, a fourth problem occurs that the reliability of the device is significantly reduced.

To alleviate the problem that a semiconductor substrate acting as the p$^+$-collector layer 1009 of the SiC-IGBT cannot be thickened, a non-punch-through structure is known that is achieved by forming the n$^-$-drift layer 1001 thicker without disposing the n-buffer layer 1008 in the SiC-IGBT depicted in FIG. 11, for example (not depicted).

However, in the case of SiC-IGBT of the non-punch-through structure, a fifth problem occurs due to the thickening of the n$^-$-drift layer. For example, since the n$^-$-drift layer is formed with a thickness greater than or equal to a width of a depletion layer formed at the time of application of a backward voltage corresponding to a predetermined breakdown voltage, the internal resistance of the n$^-$-drift layer is increased by the thickening of the n$^-$-drift layer, causing a problem of increased electric power loss.

A current epitaxial-layer forming technique causes many various crystal defects as described above present in an epitaxial layer formed by using SiC. Therefore, in the SiC-IGBT including the n$^-$-drift layer consisting of an epitaxial layer, the crystal defects in the n$^-$-drift layer increases as the n$^-$-drift layer is made thicker, leading to drastic increase in the leak current at the time of application of the backward voltage (when turned off). Therefore, the SiC-IGBT including the n$^-$-drift layer consisting of an epitaxial layer has a reduced breakdown voltage and a significantly reduced yield. On the other hand, in the SiC-IGBT including the n$^-$-drift layer consisting of an epitaxial layer, the forward voltage is more severely deteriorated and the reliability at the time of application of the forward voltage (when turned on) decreases, causing an extremely serious problem not occurring in Si-IGBT made of Si.

It has been found that the problem occurring at the time of application of the forward voltage to the SiC-IGBT including the n$^-$-drift layer consisting of an epitaxial layer is mainly attributed to the stacking fault among the crystal defects occurring in the epitaxial layer made of SiC and is generated because the stacking fault in the epitaxial layer is increased in association with the energization of the SiC-IGBT by the application of the forward voltage. However, it is not revealed which crystal defect among the crystal defects occurring in the epitaxial layer made of SiC is the main cause of the problem occurring in the SiC-IGBT including the n$^-$-drift layer consisting of the epitaxial layer at the time of application of the backward voltage.

Since the SiC-IGBT of the non-punch-through structure is not disposed with an n-buffer layer, carriers are excessively injected from a $p^+$-collector layer to an $n^-$-drift layer having an impurity concentration lower than the $p^+$-collector layer, and residual carriers remaining in the $n^-$-drift layer are increased at the time of application of the backward voltage. If the residual carriers remaining in the $n^-$-drift layer are increased, the turn-off time of the SiC-IGBT of the non-punch-through structure is elongated, causing the problem of increase in a turn-off loss.

An object of the present invention is to provide a semiconductor device with an electric power loss reduced to solve the problems of the conventional techniques described above. An object of the present invention is to provide a semiconductor device with high economic efficiency to solve the problems of the conventional techniques described above. An object of the present invention is to provide a highly reliable semiconductor device to solve the problems of the conventional techniques described above.

Means for Solving Problem

To solve the problems above and achieve an object, a semiconductor device according to the present invention has at least one or more bipolar transistors and at least one or more unipolar transistors disposed on a semiconductor substrate of a first conductivity type and made of a semiconductor material with a band gap larger than silicon. The semiconductor device includes a first semiconductor layer of the first conductivity type and constituting the semiconductor substrate on a first principal surface side of the semiconductor substrate; a second semiconductor layer of the first conductivity type and constituting the semiconductor substrate on a second principal surface side of the semiconductor substrate, the second semiconductor layer having an impurity concentration higher than the first semiconductor layer; a third semiconductor layer of the first conductivity type disposed between the first semiconductor layer and the second semiconductor layer to be in contact with at least the first semiconductor layer; a concave portion disposed on the second principal surface side of the semiconductor substrate and penetrating the second semiconductor layer to the third semiconductor layer; a fourth semiconductor layer of a second conductivity type and disposed on a bottom surface of the concave portion to be in contact with the third semiconductor layer; an output electrode of the bipolar transistor, contacting the fourth semiconductor layer; an input electrode and a control electrode of the bipolar transistor disposed on the first principal surface side of the semiconductor substrate at a position corresponding to the concave portion; a convex portion formed on the second principal surface side of the semiconductor substrate, correspondingly to the concave portion; an output electrode of the unipolar transistor disposed on a surface of the convex portion to be electrically connected to the output electrode of the bipolar transistor; an input electrode of the unipolar transistor disposed on the first principal surface side of the semiconductor device at a position corresponding to the convex portion to be electrically connected to the input electrode of the bipolar transistor; and a control electrode of the unipolar transistor disposed on the first principal surface side of the semiconductor device at a position corresponding to the convex portion to be electrically connected to the control electrode of the bipolar transistor.

The bipolar transistors are those having a built-in voltage such as an IGBT, a MAGBT, and an SI thyristor. The SI thyristor does not have the self-maintenance function of thyristor and therefore corresponds to the bipolar transistor. The unipolar transistors include a MOSFET, a JFET, a SIT, and a SIAFET.

In a semiconductor device according to the invention and based on the invention above, the unipolar transistor and the bipolar transistor are electrically connected in parallel.

In a semiconductor device according to the invention and based on the invention above, the concave portions are disposed in plural. The bipolar transistor is disposed at each of the positions corresponding to the concave portions of the semiconductor substrate. The input electrodes, the output electrodes, and the control electrodes of the bipolar transistors are respectively electrically connected.

In a semiconductor device according to the invention and based on the invention above, the convex portions are disposed in plural. The unipolar transistor is disposed at each of the positions corresponding to the convex portions of the semiconductor substrate. The input electrodes, the output electrodes, and the control electrodes of the unipolar transistors are respectively electrically connected.

In a semiconductor device according to the invention and based on the invention above, the bipolar transistor is formed by multiple bipolar transistor cells, wherein input electrodes, output electrodes, and control electrodes of the bipolar transistor cells are respectively electrically connected.

In a semiconductor device according to the invention and based on the invention above, the unipolar transistor is formed by multiple unipolar transistor cells, where input electrodes, output electrodes, and control electrodes of the unipolar transistor cells are respectively electrically connected.

In a semiconductor device according to the invention and based on the invention above, a fifth semiconductor layer of the second conductivity type of the bipolar transistor is selectively disposed on a surface layer of the first semiconductor layer at a position corresponding to the concave portion; and a sixth semiconductor layer of the first conductivity type of the bipolar transistor is selectively disposed on a surface layer of the fifth semiconductor layer. The input electrode of the bipolar transistor is in contact with the sixth semiconductor layer.

In a semiconductor device according to the invention and based on the invention above, a seventh semiconductor layer of the second conductivity type of the unipolar transistor is selectively disposed on a surface layer of the first semiconductor layer at a position corresponding to the convex portion; and an eighth semiconductor layer of the first conductivity type of the unipolar transistor is selectively disposed on a surface layer of the seventh semiconductor layer. The input electrode of the unipolar transistor is in contact with the eighth semiconductor layer.

In a semiconductor device according to the invention and based on the invention above, the bipolar transistor has an insulation gate structure with a gate insulating film disposed to be in contact with the semiconductor substrate between the semiconductor substrate and the control electrode of the bipolar transistor, and the unipolar transistor has an insulation gate structure with a gate insulating film disposed to be in contact with the semiconductor substrate, between the semiconductor substrate and the control electrode of the unipolar transistor.

In a semiconductor device according to the invention and based on the invention above, a sixth semiconductor layer of the first conductivity type of the bipolar transistor is selectively disposed on a surface layer of the first semiconductor layer at a position corresponding to the concave portion; a ninth semiconductor layer of the second conductivity type of the bipolar transistor is selectively disposed away from the sixth semiconductor on the surface layer of the first semiconductor layer at the position corresponding to the concave portion; an eighth semiconductor layer of the first conductivity type of the unipolar transistor is selectively disposed on the surface layer of the first semiconductor layer at a position corresponding to the convex portion; and a tenth semiconductor layer of the second conductivity type of the unipolar transistor is selectively disposed away from the eighth semiconductor layer on the surface layer of the first semiconductor layer, at the position corresponding to the convex portion. The bipolar transistor has a gate structure with the control electrode of the bipolar transistor disposed to be in contact with the ninth semiconductor layer. The unipolar transistor has a gate structure with the control electrode of the unipolar transistor disposed to be in contact with the tenth semiconductor layer.

In a semiconductor device according to the invention and based on the invention above, the fourth semiconductor layer is an epitaxial layer grown on a surface of the third semiconductor layer exposed on the bottom surface of the concave portion.

In a semiconductor device according to the invention and based on the invention above, the fourth semiconductor layer is a semiconductor layer formed by implanting a second conductivity type impurity into the third semiconductor layer exposed on the bottom surface of the concave portion.

In a semiconductor device according to the invention and based on the invention above, an electric field relaxation layer surrounds the bipolar transistor and the unipolar transistor.

In a semiconductor device according to the invention and based on the invention above, the electric field relaxation layer is disposed on the semiconductor substrate at a position corresponding to a convex portion disposed on an outer peripheral portion.

In a semiconductor device according to the invention and based on the invention above, the third semiconductor layer is in contact with the second semiconductor layer.

According to the present invention, when a gate voltage is applied to the gate electrodes (control electrodes) of both elements of the bipolar transistor and the unipolar transistor through the configuration described above, the bipolar transistor such as the SiC-IGBT consisting of the wide-gap semiconductor material cannot be driven by a forward voltage less than or equal to the built-in voltage while the parallel-connected unipolar transistor such as a MOSFET made of the wide-gap semiconductor material can be driven from near zero V. Both elements of the bipolar transistor and the unipolar transistor can be driven by a forward voltage greater than or equal to the built-in voltage. As a result, since the output can be extracted at the forward voltage less than or equal to the built-in voltage of the bipolar transistor, the semiconductor device of the present invention can significantly reduce the electric power loss to solve the first problem.

When the gate voltage is applied to the gate electrodes of both elements of the bipolar transistor and the unipolar transistor, since the operation as the unipolar transistor and the energization are achieved between the emitter (input electrode) of the bipolar transistor and the drain (output electrode) of the unipolar transistor by the forward voltage less than or equal to the built-in voltage of the bipolar transistor, the semiconductor device area can effectively be utilized. When the forward voltage greater than or equal to the built-in voltage of the bipolar transistor is applied, the bipolar transistor is driven and carriers injected from the $p^+$-collector layer (forth semiconductor layer) of the bipolar transistor flow into the $n^-$-drift layer (first semiconductor layer) of the unipolar transistor and cause conductivity modulation. Therefore, the unipolar transistor operates as the bipolar transistor. This enables effective utilization of the semiconductor device area.

When the semiconductor device (hereinafter, combined switching device) of the present invention is made up, an n-type SiC support substrate is used that has a thickness greater than or equal to 300 μm and an impurity concentration higher than the $n^-$-drift layer, for example. The SiC support substrate acts as the n-drain layer (second semiconductor layer) of the unipolar transistor. The n-buffer layer (third semiconductor layer) and the $n^-$-drift layer are sequentially stacked on a first principal surface of the SiC support substrate to make up a SiC substrate, and the bipolar transistor and the unipolar transistor are disposed on this SiC substrate.

By way of example, the configuration of the bipolar transistor (or unipolar transistor) having an insulated gate structure will be described. A p-body layer (fifth semiconductor layer) is selectively disposed on the surface of the $n^-$-drift layer. Multiple $n^+$-emitter layers (sixth semiconductor layers, or $n^+$-source layers: eighth semiconductor layers) are disposed on the surface layer of the p-body layer. An emitter electrode (or a source electrode) is disposed on the surfaces of the p-body layer and the plurality of the $n^+$-emitter layers (or the $n^+$-source layers). A gate electrode is disposed via a gate insulating film on the p-body layer between the $n^-$-drift layer and the $n^+$-emitter layers (or the $n^+$-source layers). The gate insulating film and the gate electrode are disposed such that each of the ends is located across the $n^-$-drift layer and the $n^+$-emitter layers (or the $n^+$-source layers).

Before the various electrodes of each of the bipolar transistor and the unipolar transistor are formed, the SiC substrate is thinly processed from the second principal surface of the SiC substrate until the thickness of the n-drain layer reaches 150 μm or less, preferably, 80 μm or less by a known technique such as polishing, grinding, and etching, for example. In the principal surface on the processed side of the SiC substrate, for example, an outer peripheral portion forms a convex portion, and concave portions and a convex portion are disposed such that a center portion of the SiC substrate has multiple protrusions/recesses.

As a result, in the arrangement in this combined switching device, for example, a breakdown voltage structure including an electric field relaxation layer such as a Junction Termination Extension (JTE) is disposed on a first principal surface opposite to the convex portion of the outer peripheral portion of the SiC substrate; the bipolar transistor is disposed on the concave portion adjacent to the inside of the convex portion of the outer peripheral portion of the SiC substrate; and the unipolar transistor is disposed on the convex portion adjacent to the inside.

The concave portions are disposed at a depth making the n-buffer layer exposed at the bottom surfaces of the concave portions, and the $p^+$-collector layer having a concentration higher than the n-buffer layer is disposed on the surface of the n-buffer layer exposed on the bottom surfaces of the concave portions. A collector electrode is formed on the surface of the $p^+$-collector layer. A drain electrode of the unipolar transistor is disposed on at least a surface of the convex portion. The drain electrode of the unipolar transistor may be disposed across the surface and side surfaces of the convex portion. The collector electrode of the bipolar transistor and the drain electrode of the unipolar transistor are electrically connected.

When the combined switching device of the present invention has the structure described above, the gate layers (the ninth semiconductor layer and the tenth semiconductor layer), the emitter layer, and the source layer in need of fine patterns for higher performance can be formed while the SiC support substrate acting as the n-drain layer is thick. Therefore, the curvature of the SiC wafer during the course of fabricating of the combined switching device can significantly be suppressed and fine patterns are easily formed by photo-etching etc. Additionally, the elements formed on the SiC wafer and making up the combined switching device can be prevented from being destroyed due to mechanical stress and heat stress and a multiplicity of defects can be prevented from occurring.

When the combined switching device of the present invention has the structure described above, the combined switching device can be configured by using an n-type SiC support substrate without using a thick p-type SiC support substrate leading to the formation of a multiplicity of crystal defects. Since the n-type SiC support substrate is finally thinned to a thickness of 150 μm or less, preferably, 80 μm or less, the internal resistance can significantly be suppressed in the n-drain layer portion consisting of the SiC support substrate. Since the refinement of elements can be achieved and the internal resistance can significantly be suppressed in the n-drain layer portion consisting of the SiC support substrate as described above, the intrinsic high performance, i.e., the high speed and low loss, of the combined switching device made of the wide-gap semiconductor material can be fulfilled while the yield can be improved. Therefore, the economic efficiency can considerably be improved to solve the second problem.

Since the $p^+$-collector layer is formed on the bottom surface of the concave portion, the direct connection at the time of die bonding can be avoided between the package and the $p^+$-collector layer having heat expansion coefficients significantly different from each other. Therefore, the direct application of heat stress and mechanical stress to the $p^+$-collector layer can be prevented to significantly suppress the occurrence of cracks and defects. Since the SiC substrate is supported by bringing the convex portions of the SiC substrate into contact with the package at the time of wire bonding of the SiC substrate, the significant alleviation can be achieved in the increase in stress applied to the concave portions due to the mechanical stress applied for increasing a crimping force of wires, and the occurrence of cracks and defects can further be suppressed. Therefore, the leak current in the junction between the $p^+$-collector layer and the n-buffer layer can be restrained from increasing due to the occurrence of defects in the $p^+$-collector layer, and the performance of the bipolar transistor of the combined switching device can be restrained from deteriorating to solve the third problem.

As described above, the curvature of the SiC wafer can be suppressed that is generated during the course of fabricating of the combined switching device due to the thinness of the SiC support substrate acting as the n-drain layer and the thinness of the $p^+$-collector layer, and the heat stress and the mechanical stress to the SiC support substrate can be suppressed that increases during the course of mounting of the combined switching device, thereby significantly reducing the occurrence of various defects such as stacking faults. As a result, the internal resistance of the combined switching device can be restrained from increasing due to the stacking faults and the reliability can be improved to solve the fourth problem.

The configuration equipped with the n-buffer layer enables the employment of a "punch-through structure" capable of making the $n^-$-drift layer thinner. Since a semiconductor device of the punch-through structure has a thinner depletion layer, when a backward voltage corresponding to a breakdown voltage is applied, the depletion layer spreads to the entire $n^-$-drift layer and further spreads into the n-buffer layer having an impurity concentration higher than the $n^-$-drift layer. However, the depletion layer can be terminated within the n-buffer layer to ensure the breakdown voltage by forming the n-buffer layer with a predetermined thickness and a predetermined impurity concentration.

As a result, the $n^-$-drift layer can be made fairly thinner than a semiconductor device of the non-punch-through structure and therefore, the internal resistance of the $n^-$-drift layer can be reduced by the thinning of the $n^-$-drift layer to decrease the electric power loss. The leak current drastically increased by thickening the $n^-$-drift layer can be reduced at the time of application of the backward voltage, and the yield is significantly increased. On the other hand, the deterioration of the forward voltage at the time of energization is also suppressed when the combined switching device is turned on and the reliability can be improved, thereby solving the fifth problem. Since the excessive injection of carriers from the $p^+$-collector layer can be suppressed, the residual carriers can be reduced when the combined switching device is turned off, and the turn-off time can be shortened to reduce the turn-off loss.

As described above, the combined switching device can output electric power even at the time of lower forward bias near zero V and can output large electric power at a voltage greater than or equal to the built-in voltage of the bipolar transistor because of the conductivity modulation effect. The curvature of the SiC wafer during the course of fabricating of the semiconductor device can significantly be suppressed and the various defects including the stacking faults occurring within the semiconductor device can significantly be suppressed. Since the thickness of the $n^-$-drift layer can be reduced, the high performance of the combined switching device such as a lower loss and a lower leak current can be realized and the improvement in economic efficiency can also be achieved because of the improvements in reliability and yield.

Effect of the Invention

The semiconductor device according to the present invention produces the effect of enabling a reduction in electric power loss. The semiconductor device according to the present invention produces the effect of enabling improvement in economic efficiency. The semiconductor device according to the present invention produces the effect of enabling improvement in reliability.

BRIEF DESCRIPTION OF DRAWINGS

FIG. 11 is a cross-sectional view of a conventional switching device.

BEST MODE(S) FOR CARRYING OUT THE INVENTION

Figure 1:
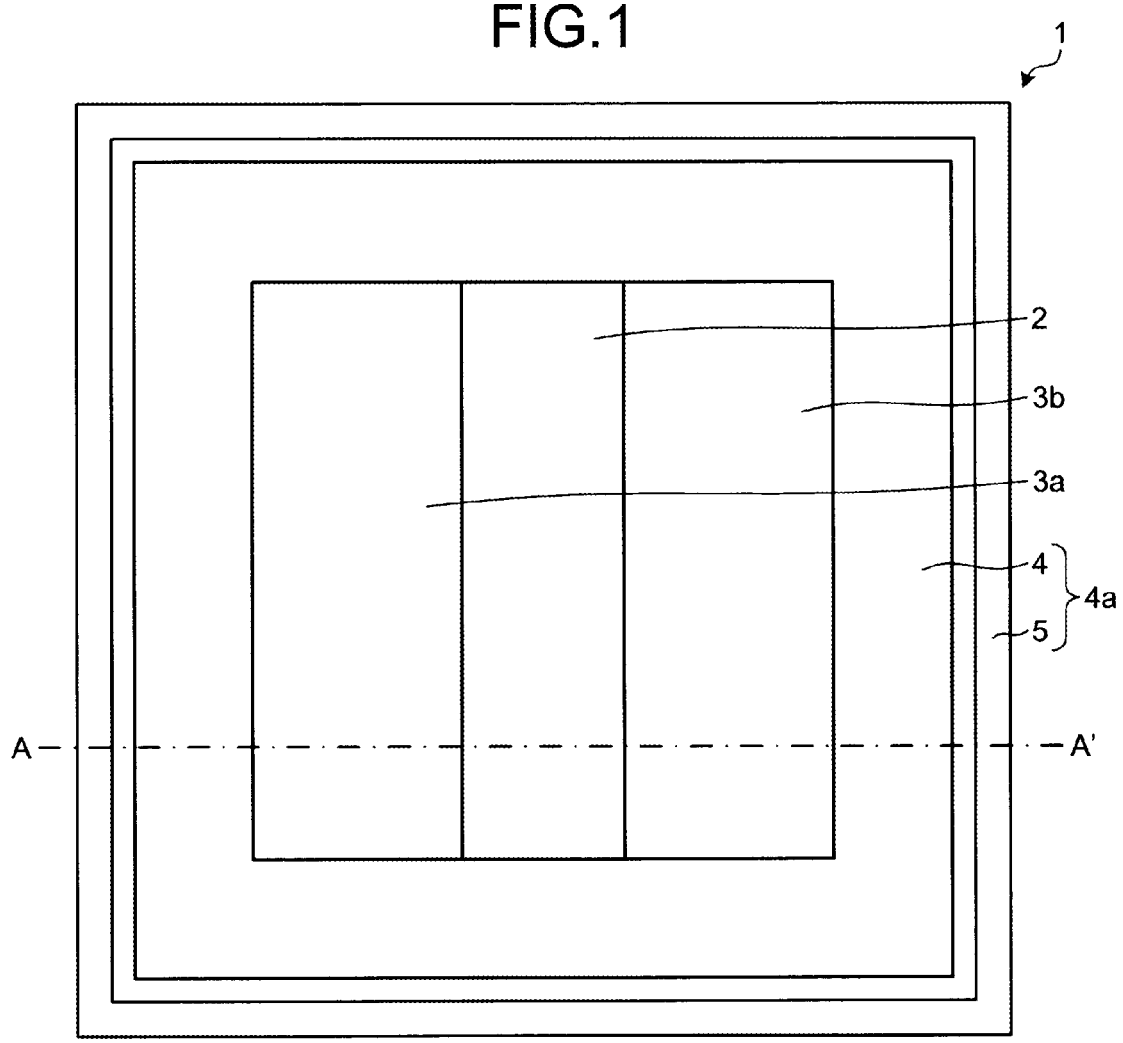
FIG. 1 is a plane view of a planar layout of a semiconductor device according to a first embodiment.

Preferred embodiments of a semiconductor device and a fabrication method of the semiconductor device according to the present invention will be described in detail with reference to the accompanying drawings. In this description and the accompanying drawings, the layers and areas starting with n or p respectively mean that electrons or holes are majority carriers. Additionally, + and − added to n or p mean that impurity concentration is higher and lower, respectively, than layers or areas without + and −. In the description and the accompanying drawings of the following embodiments, identical constituent elements are denoted by the same reference numerals and will not repeatedly be described.

(First Embodiment)

Figure 2:
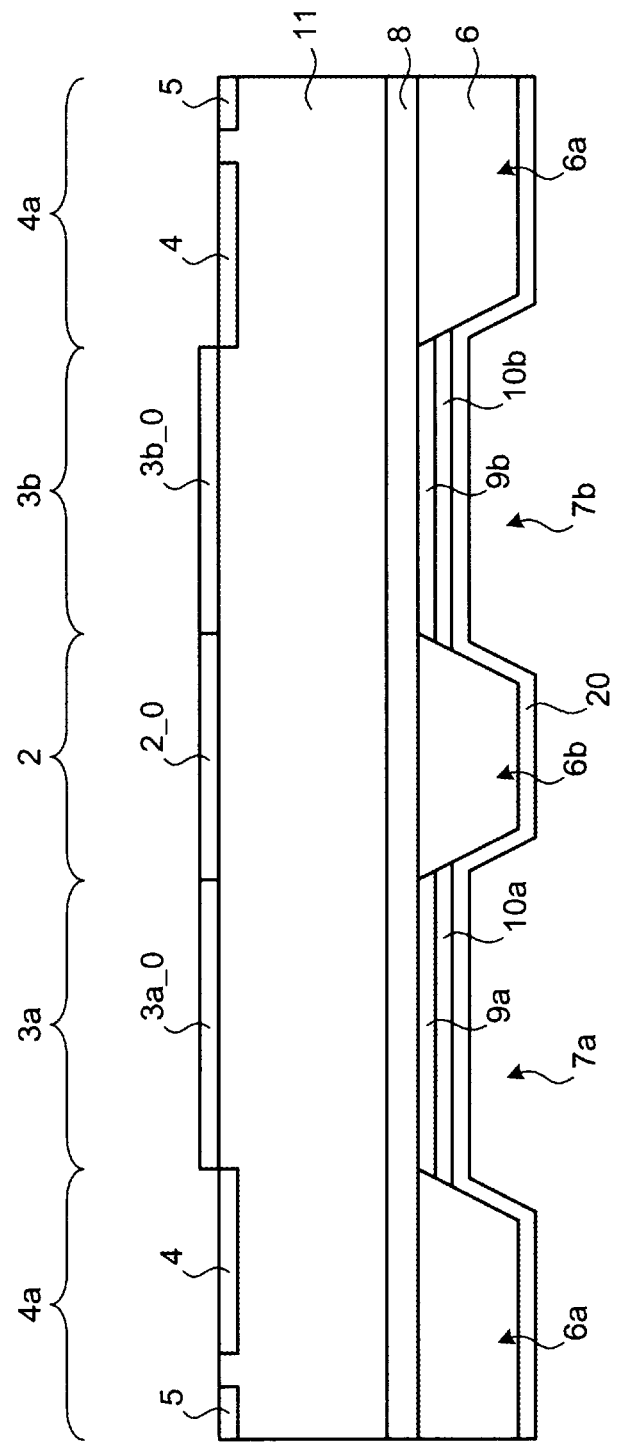
FIG. 2 is a cross-sectional view taken along a cutting plane line A-A' of FIG. 1.

FIG. 1 is a plane view of a planar layout of a semiconductor device according to a first embodiment. FIG. 2 is a cross-sectional view taken along a cutting plane line A-A' of FIG. 1. The semiconductor device depicted in FIGS. 1 and 2 is a switching device (hereinafter, combined switching device) 1 having, for example, a 10-kV class breakdown voltage made up of multiple elements formed on the same semiconductor substrate (SiC substrate) made of a material with a band gap wider than silicon, such as silicon carbide (SiC) four-layer periodic hexagonal crystals (4H—SiC).

As depicted in FIG. 1, in the planar layout of the combined switching device 1, a MOSFET area 2 is disposed in a center portion of the SiC substrate as a formation area of an insulated gate field effect transistor (MOSFET, unipolar transistor) made of wide-gap semiconductor. IGBT areas 3a and 3b are arranged as formation areas of an insulated gate bipolar transistor (IGBT, bipolar transistor) made of wide-gap semiconductor in contact with the MOSFET area 2, sandwiching the MOSFET area 2.

In an outer peripheral portion of the SiC substrate, a JTE (Junction Termination Extension, electric field relaxation area) 4 and an n-channel stopper 5 are disposed separately from each other as a breakdown voltage structure 4a. The MOSFET area 2 and the IGBT areas 3a and 3b are surrounded by the breakdown voltage structure 4a. The JTE 4 surrounds the MOSFET area 2 and the IGBT areas 3a and 3b. The n-channel stopper 5 surrounds the JTE 4.

The JTE 4 is in contact with the IGBT areas 3a and 3b in a direction of the MOSFET area 2 along the parallel arrangement of the MOSFET area 2 and the IGBT areas 3a and 3b (hereinafter, a parallel element arrangement direction) and is in contact with the MOSFET area 2 and the IGBT areas 3a and 3b in a direction orthogonal to the parallel element arrangement direction (hereinafter, an orthogonal element arrangement direction).

The MOSFET area 2 is disposed with a MOSFET formed by connecting multiple MOSFET cells (not depicted) in parallel. The MOSFET cells have a rectangular planar shape, for example. The MOSFET cells are arranged in parallel in the parallel element arrangement direction. Gate electrodes (control electrodes), source electrodes (input electrodes), and drain electrodes (output electrodes) of a plurality of the MOSFET cells are respectively electrically connected.

Each of the IGBT areas 3a and 3b is disposed with an IGBT formed by connecting multiple IGBT cells (not depicted) in parallel. The IGBT cells have a rectangular planar shape, for example. In the IGBT areas 3a and 3b, the IGBT cells are arranged in parallel in the parallel element arrangement direction. Gate electrodes (control electrodes), emitter electrodes (input electrodes), and collector electrodes (output electrodes) of the IGBT cells are respectively electrically connected.

Gate electrodes of the MOSFET disposed in the MOSFET area 2 and the IGBTs disposed in the IGBT areas 3a and 3b are electrically connected to each other (not depicted). A source electrode of the MOSFET disposed in the MOSFET area 2 and emitter electrodes of the IGBTs disposed in the IGBT areas 3a and 3b are electrically connected (not depicted). A drain electrode of the MOSFET disposed in the MOSFET area 2 and collector electrodes of the IGBTs disposed in the IGBT areas 3a and 3b are electrically connected (not depicted).

The combined switching device 1 has a square planar shape, for example. The combined switching device 1 may have a width of 4 mm in both the parallel element arrangement direction and the orthogonal element arrangement direction. Both the MOSFET cells and the IGBT cells may have a width of about 16 μm in the parallel element arrangement direction and a width of about 2.5 mm in the orthogonal element arrangement direction. The MOSFET area 2 is disposed with about 45 MOSFET cells, for example (not depicted). In each of the IGBT areas 3a and 3b, 55 IGBT cells (not depicted) are disposed. The JTE 4 may have a width of about 500 μm in both the parallel element arrangement direction and the orthogonal element arrangement direction.

A main cross-sectional structure of the combined switching device 1 will be described with reference to FIG. 2. As depicted in FIG. 2, the combined switching device 1 is fabricated by using a SiC support substrate acting as an n-drain layer (second semiconductor layer) 6 of the MOSFET cells. On a first principal surface of the SiC support substrate, an n-type epitaxial layer acting as an n-buffer layer (third semiconductor layer) 8 is formed by using a wide-gap semiconductor material such as SiC. On a surface of the n-buffer layer 8, an n-type epitaxial layer acting as an n⁻-drift layer (first semiconductor layer) 11 is formed by using a wide-gap semiconductor material such as SiC.

The n⁻-drift layer 11 has an impurity concentration lower than the n-buffer layer 8. The n-buffer layer 8 has an impurity concentration lower than the n-drain layer 6. A substrate formed by stacking the SiC support substrate acting as the n-drain layer 6, the n-buffer layer 8 made of the wide-gap semiconductor material, and the n⁻-drift layer 11 made of the wide-gap semiconductor material is hereinafter defined as a SiC substrate (in second to sixth embodiments, a substrate formed by stacking a SiC support substrate acting as an n-drain layer, an n-buffer layer, and an n⁻-drift layer is defined as a SiC substrate in the same way).

In the MOSFET area 2, a MOSFET top surface element structure 2_0 is formed on a first principal surface of the SiC substrate (a surface of the n⁻-drift layer 11). In the IGBT areas 3a and 3b, IGBT top surface element structures 3a_0 and 3b_0 are formed on the first principal surface of the SiC substrate.

In the breakdown voltage structure 4a, the JTE 4 is disposed on a surface layer of the n⁻-drift layer 11 on the first principal surface side of the SiC substrate. The JTE 4 is in contact with the top surface element structure 3a_0 on the outer peripheral portion side of the IGBT area 3a_0 and is in contact with the top surface element structure 3b_0 on the outer peripheral portion side of the IGBT area 3b. For example, the JTE 4 is in contact with a p-body layer (fifth semiconductor layer, not depicted) of the IGBT cell located closest to the breakdown voltage structure 4a in the IGBT area 3a and is in contact with a p-body layer (not depicted) of the IGBT cell located closest to the breakdown voltage structure 4a in the IGBT area 3b.

In the breakdown voltage structure 4a, the n-channel stopper 5 having an impurity concentration higher than the $n^-$-drift layer 11 is disposed on a surface layer of the first principal surface of the SiC substrate. For example, the n-channel stopper 5 is disposed on the outer peripheral end portion of the first principal surface of the SiC substrate. The n-channel stopper 5 is disposed separately from the JTE 4 and the $n^-$-drift layer 11 is exposed on the first principal surface of the SiC substrate between the re-channel stopper 5 and the JTE 4.

In the IGBT areas 3a and 3b, the concave portions 7a and 7b penetrating the n-drain layer 6 and reaching the n-buffer layer 8 are respectively disposed on the second principal surface side (the n-drain layer 6 side) of the SiC substrate. Therefore, the IGBTs are disposed at positions corresponding to the concave portions 7a and 7b of the SiC substrate. The n-type buffer layer 8 is exposed on the bottom surfaces of the concave portions 7a and 7b. Since the concave portions 7a and 7b are disposed in the second principal surface of the SiC substrate in the IGBT areas 3a and 3b, a convex portion 6b is formed in the MOSFET area 2 and a convex portion 6a is formed in the breakdown voltage structure 4a on the second principal surface of the SiC substrate.

Therefore, the MOSFET is disposed at a position corresponding to the convex portion 6b of the SiC substrate. The breakdown voltage structure 4a is disposed at a position corresponding to the convex portion 6b of the SiC substrate. As a result, on the second principal surface of the SiC substrate, recesses and protrusions are formed, consisting of the convex portion 6a, the concave portion 7a, the convex portion 6b, the concave portion 7b, and the convex portion 6a from the breakdown voltage structure 4a on the IGBT area 3a side of the SiC substrate through the MOSFET area 2 in the center portion toward the breakdown voltage structure 4a on the IGBT area 3b side of the SiC substrate.

Although the recesses and protrusions consisting of the one convex portion 6a and the two concave portions 7a and 7b are disposed on the second principal surface of the SiC substrate in the combined switching device depicted in FIG. 2, more recesses and protrusions may further be disposed. If more recesses and protrusions are disposed on the second principal surface of the SiC substrate, MOSFETs and IGBTs are respectively disposed at positions corresponding to convex portions and concave portions on the SiC substrate. The gate electrodes, the source electrodes, and the drain electrodes of the MOSFETs disposed at positions corresponding to the convex portions are respectively electrically connected. The gate electrodes, the emitter electrodes, and the collector electrodes of the IGBTs disposed at positions corresponding to the concave portions are respectively electrically connected.

The surfaces of the n-buffer layer 8 exposed at the concave portions 7a and 7b of the second principal surface of the SiC substrate are respectively disposed with $p^+$-collector layers (fourth semiconductor layers) 9a and 9b. The $p^+$-collector layers 9a and 9b have an impurity concentration higher than the n-type drift layer 11. Metal films (hereinafter, Ti films) 10a and 10b made of, for example, titanium (Ti) are respectively formed on the surfaces of the $p^+$-collector layers 9a and 9b. The Ti films 10a and 10b form ohmic contacts with the $p^+$-collector layers 9a and 9b. The Ti films 10a and 10b cover the $p^+$-collector layers 9a and 9b in the concave portions 7a and 7b.

A collector electrode 20 is disposed on the surfaces of the Ti films 10a and 10b. For example, the collector electrode 20 may be a laminated film stacked in the order of a nickel (Ni) layer and a gold (Au) layer from the side of the Ti films 10a and 10b, for example. The collector electrode 20 is extensively disposed on the surfaces of the convex portions 6a and 6b to entirely cover the surfaces of the convex portions 6a and 6b, the surfaces of the Ti films 10a and 10b, and the portions of the side walls of the concave portions 7a and 7b exposing the n-drain layer 6. The collector electrode 20 disposed on the side surfaces and the surfaces of the convex portions 6a and 6b functions as the drain electrode of the MOSFET cells in the MOSFET area 2.

Figure 3:
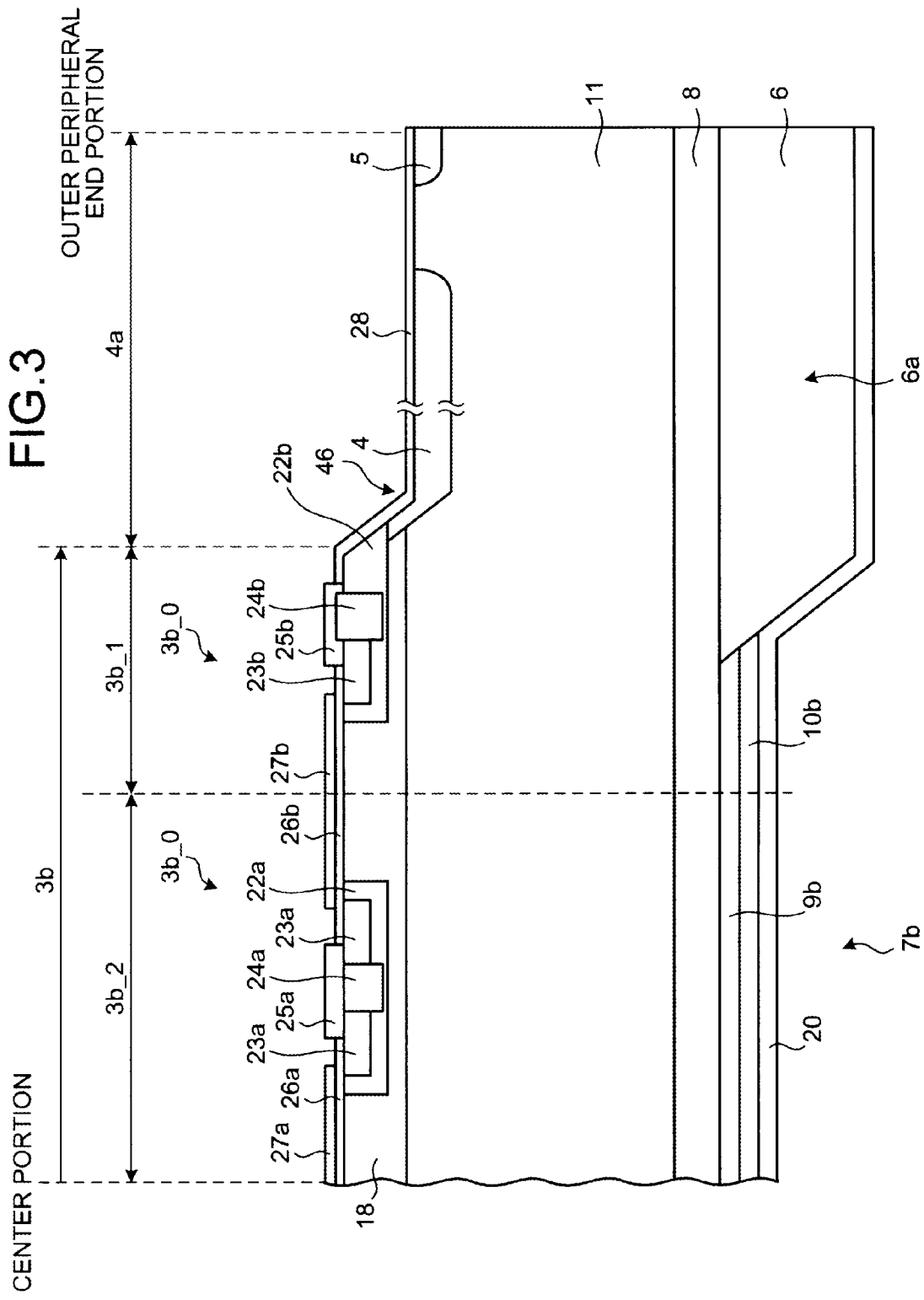
FIG. 3 is a cross-sectional view of a relevant portion of the semiconductor device according to the first embodiment.

FIG. 3 is a cross-sectional view of a relevant portion of the semiconductor device according to the first embodiment. FIG. 3 depicts a cross-sectional structure in the vicinity of the breakdown voltage structure 4a of the combined switching device 1 depicted in FIGS. 1 and 2. Although the cross-sectional structure in the vicinity of the breakdown voltage structure 4a on the IGBT area 3b side will hereinafter be described, the cross-sectional structure in the vicinity of the breakdown voltage structure 4a on the IGBT area 3a side is symmetrical with the cross-sectional structure in the vicinity of the breakdown voltage structure 4a on the IGBT area 3b side about the MOSFET area 2.

As depicted in FIG. 3, in the breakdown voltage structure 4a, grooves are disposed in the first principal surface of the SiC substrate, and the first principal surface of the SiC substrate in the breakdown voltage structure 4a is lower than the first principal surface of the SiC substrate in the MOSFET area 2 and the IGBT areas 3a and 3b. A portion (hereinafter, mesa portion) between the grooves corresponds to the MOSFET area 2 and the IGBT areas 3a and 3b.

Because of the grooves disposed in the breakdown voltage structure 4a, the JTE 4 and the n-channel stopper 5 are formed at positions, for example, about 2 μm lower than the top surface element structure (not depicted) of the MOSFET cells disposed in the MOSFET area 2 and the top surface element structure 3b_0 of the IGBT cells disposed in the IGBT area 3b. The grooves disposed in the breakdown voltage structure 4a are formed by etching, for example. In FIG. 3, each of reference numerals 3b_1 and 3b_2 sectioned by dashed lines denotes an IGBT cell disposed in the IGBT area 3b.

The top surface element structure 3b_0 of the IGBT cells 3b_1 and 3b_2 is disposed on a p-type resistance reduction layer 18 disposed on the surface layer of the $n^-$-drift layer 11. The resistance reduction layer 18 has an impurity concentration higher than the $n^-$-drift layer 11. The resistance reduction layer 18 is continuously formed to the surface layer of the $n^-$-drift layer 11 in the MOSFET area 2 not depicted. In the top surface element structure 3b_0 of the IGBT cell 3b_2, a p-body layer 22a is selectively disposed on a surface layer of the resistance reduction layer 18.

An $n^+$-emitter layer (sixth semiconductor layer) 23a is selectively disposed on a surface layer of the p-body layer 22a. A $p^+$-contact layer 24a is disposed that penetrates the $n^+$-emitter layer 23a into the p-body layer 22a from the first principal surface side of the SiC substrate. A gate electrode 27a is disposed via a gate insulating film 26a on a surface of the p-body layer 22a exposed on the first principal surface of the SiC substrate between the $n^+$-emitter layer 23a and the $n^-$-drift layer 11 of the IGBT cell 3b_2 on the MOSFET area 2 side of the IGBT cell 3b_2.

The gate electrode 27a is extended and disposed via the gate insulating film 26a on a surface of a p-body layer (not depicted) of an IGBT cell not depicted adjacent to the MOSFET area 2 side of the IGBT cell 3b_2.

A gate electrode 27b is disposed via a gate insulating film 26b on a surface of the p-body layer 22a exposed on the first principal surface of the SiC substrate between the n$^+$-emitter layer 23a and the n$^-$-drift layer 11 of the IGBT cell 3b_2 on the breakdown voltage structure 4a side of the IGBT cell 3b_2. The gate electrode 27b is extended and disposed via the gate insulating film 26b on a surface of a p-body layer 22b of an IGBT cell 3b_1 adjacent to the breakdown voltage structure 4a side of the IGBT cell 3b_2. Therefore, the top surface element structure of the IGBT cell 3b_2 is an insulated gate structure.

An emitter electrode 25a is in contact with the n$^+$-emitter layer 23a and the p$^+$-contact layer 24a. The emitter electrode 25a forms an ohmic contact with the p$^+$-contact layer 24a. The emitter electrode 25a is insulated from the gate electrodes 27a and 27b by an interlayer insulating film (not depicted).

The top surface element structure 3b_0 of the IGBT cell 3b_1 has the structure of the IGBT cell 3b_2 except that an n$^+$-emitter layer 23b is not disposed on the JTE 4 side of a p$^+$-contact layer 24b. The structures of the p$^+$-contact layer 24b, an emitter electrode 25b, the gate insulating film 26b, and the gate electrode 27b of the IGBT cell 3b_1 are the same as the p$^+$-contact layer 24a, the emitter electrode 25a, the gate insulating film 26a, and the gate electrode 27a of the IGBT cell 3b_2.

Although only the IGBT cells 3b_1 and 3b_2 are depicted in FIG. 3, a plurality of IGBT cells is disposed in parallel toward the center portion (the MOSFET area 2) of the SiC substrate from the IGBT cell 3b_2. The structure of the top surface element structure 3b_0 of the IGBT cells disposed toward the center portion of the SiC substrate from the IGBT cell 3b_2 is the same as the top surface element structure 3b_0 of the IGBT cell 3b_2. The n-buffer layer 8, the p$^+$-collector layer 9b, the Ti film 10b, and the collector electrode 20 are disposed on the entire surface of the concave portion 7b of the second principal surface of the SiC substrate and are the areas common to all the IGBT cells.

The JTE 4 is connected to the p-body layer 22b of the IGBT cell 3b_1 disposed on the side of the IGBT area 3b closest to the breakdown voltage structure 4a. Since the JTE 4 is connected to the p-body layer 22b, the electric field can be reduced at the end of junction with JTE 4 on the JTE 4 side of the p-body layer 22b and in a corner portion 4b of the mesa portion so as to improve the breakdown voltage of the combined switching device 1.

Although not depicted in FIG. 3, the JTE 4 is also connected to the p-body layer 22b at the both end portions of the IGBT cells 3b_1 and 3b_2 in the orthogonal element arrangement direction (the direction perpendicular to the plane of FIG. 3). In the breakdown voltage structure 4a, a passivation film 28 is disposed on the first principal surface of the SiC substrate. The passivation film 28 covers the surfaces of the JTE4 and the n-channel stopper 5. In the breakdown voltage structure 4a, the collector electrode 20 is disposed on the surface and the side surface of the convex portion 6a of the second principal surface of the SiC substrate to cover the n-drain layer 6.

Figure 4:
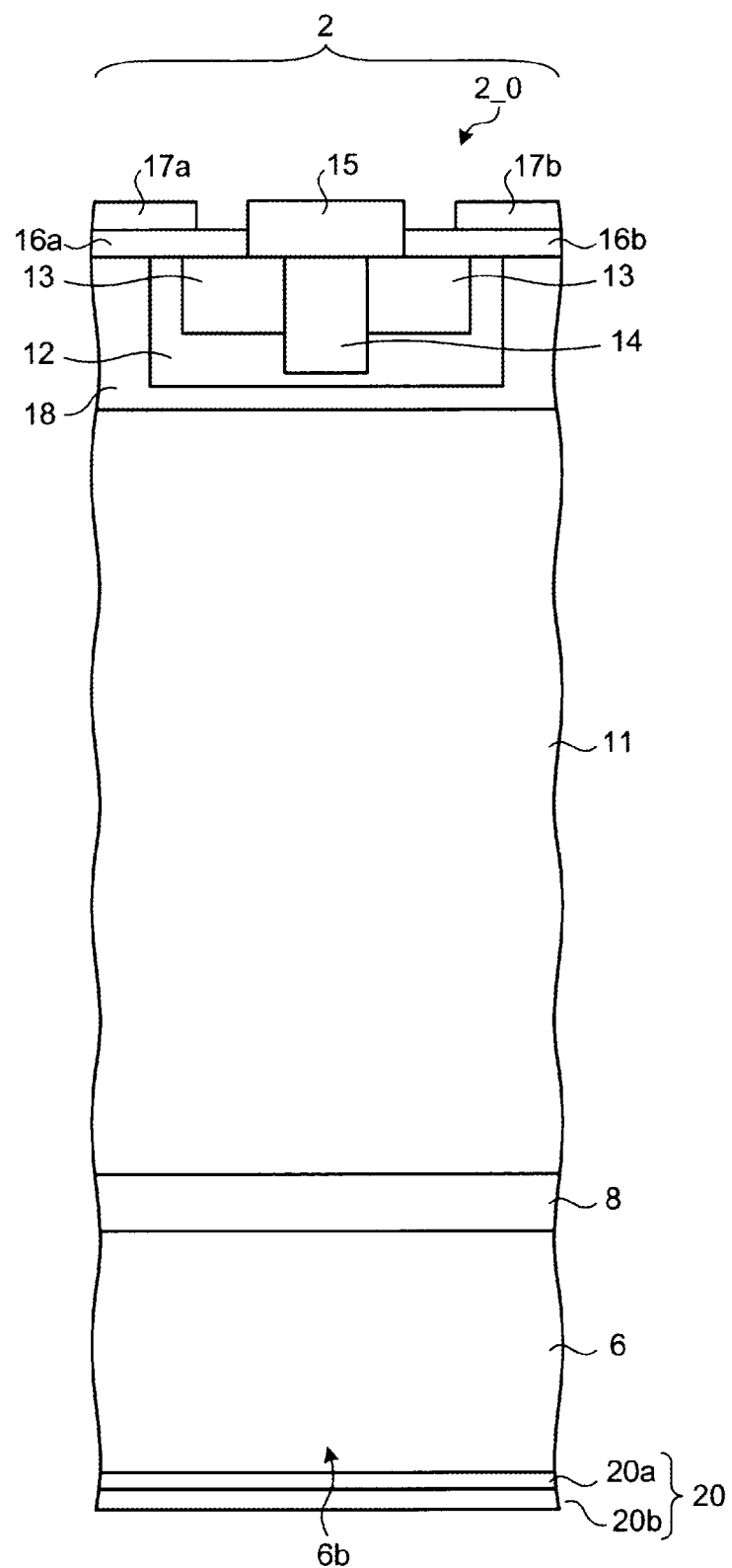
FIG. 4 is a cross-sectional view of a relevant portion of the semiconductor device according to the first embodiment.

FIG. 4 is a cross-sectional view of a relevant portion of the semiconductor device according to the first embodiment. FIG. 4 depicts a cross-sectional structure of one MOSFET cell formed in the MOSFET area 2 of the combined switching device 1 depicted in FIGS. 1 and 2. In FIG. 4, the left side of the plane of FIG. 4 leads to the IGBT area 3a and the right side of the plane of FIG. 4 leads to the IGBT area 3b. The MOSFET cell has the same cross-sectional structure as the IGBT cell 3b_2 except the n-drain layer 6.

Therefore, the top surface element structure 2_0 of the MOSFET cell is the same as the top surface element structure 3b_0 of the IGBT cell 3b_2. For example, on the first principal surface side of the SiC substrate, a p-body layer (seventh semiconductor layer) 12 is selectively disposed on the p-type resistance reduction layer 18 disposed on the surface layer of the n$^-$-drift layer 11. An n$^+$-source layer (eighth semiconductor layer) 13 is selectively disposed on a surface layer of the p-body layer 12. A p$^+$-contact layer 14 is disposed that penetrates the n$^+$-source layer 13 into the p-body layer 12 from the first principal surface side of the SiC substrate.

A gate electrode 17a is disposed via a gate insulating film 16a on a surface of the p-body layer 12 exposed on the first principal surface of the SiC substrate between the n$^+$-source layer 13 of the MOSFET cell and an n$^+$-source layer of a MOSFET cell not depicted adjacent to the IGBT area 3a side of the MOSFET cell (the left side of the plane of FIG. 4). A gate electrode 17b is disposed via a gate insulating film 16b on a surface of the p-body layer 12 exposed on the first principal surface of the SiC substrate between the n$^+$-source layer 13 of the MOSFET cell and an n$^+$-source layer of a MOSFET cell not depicted adjacent to the IGBT area 3b side of the MOSFET cell.

A source electrode 15 is in contact with the n$^+$-source layer 13 and the p$^+$-contact layer 14. The source electrode 15 forms an ohmic contact with the p$^+$-contact layer 14. The source electrode 15 is insulated from the gate electrodes 17a and 17b by an interlayer insulating film (not depicted).

The n-buffer layer 8, the n-drain layer 6, and the collector electrode 20 functioning as the drain electrode are disposed on the surface of the convex portion 6b and are areas common to all the MOSFET cells. The collector electrode 20 is formed by stacking an Ni film 20a and an Au film 20b functioning as contact metal of the n-drain layer 6 of the MOSFET cell.

A fabricating method of the combined switching device 1 according to the first embodiment will be described. First, an n-type SiC support substrate acting as the n-drain layer 6 is prepared. A diameter of the SiC support substrate may be three inches, for example. The SiC support substrate is a substrate of four-layer periodic hexagonal crystals (4H—SiC), for example, and is a substrate having an eight-degree off-angle surface from the (0001) Si crystal plane.

On the first principal surface of the SiC support substrate, the nitrogen- (N-) doped n-buffer layer 8 is epitaxially grown with a thickness of about 10 μm, for example, and an impurity concentration of $8 \times 10^{16}$ cm$^{-3}$, for example. On the surface of the n-buffer layer 8, the nitrogen-doped n$^-$-drift layer 11 is epitaxially grown with a thickness of about 110 μm, for example, and an impurity concentration of $3 \times 10^{14}$ cm$^{-3}$, for example. As a result, the SiC substrate is completed with the n-buffer layer 8 and the n$^-$-drift layer 11 stacked on the first principal surface of the SiC support substrate.

For the resistance reduction of parasitic JFTE present between the p-body layers 12, 22a, and 22b, the nitrogen-doped n-type JFET resistance reduction layer 18 is epitaxially grown with a thickness of about 1 μm, for example, and an impurity concentration of $8 \times 10^{15}$ cm$^{-3}$, for example. The p-body layers 12, 22a, and 22b are formed on the surface layer of the resistance reduction layer 18 by ion implantation. The ion implantation for forming the p-body layers 12, 22a, and 22b may use Al as a dopant and a dose amount of about $3 \times 10^{12}$ cm$^{-2}$, for example.

The n$^+$-source layer 13 and the n$^+$-emitter layers 23a and 23b are respectively formed on the surface layers of the p-body layers 12, 22a, and 22b by ion implantation. The ion implantation for forming the n$^+$-source layer 13 and the n$^+$-emitter layers 23a and 23b may use nitrogen (N) as a dopant and a dose amount of about $3 \times 10^{14}$ cm$^{-2}$, for example. The n$^+$-source layer 13 and the n$^+$-emitter layers 23a and 23b may be formed such that channel lengths of the MOSFET cells and the IGBT cells are set to about 0.5 μm.

To protect the first principal surface of the SiC substrate, the first principal surface of the SiC substrate is entirely covered by an insulating protection film such as resin (resin), for example. The SiC support substrate is polished from the second primary surface side of the SiC substrate, i.e., from the second primary surface of the SiC support substrate acting as the n-drain layer 6 until the thickness of the SiC support substrate is reduced to about 70 μm to make the SiC support substrate thinner. As a result of thinning of the SiC support substrate, the overall thickness of the SiC substrate is about 200 μm, for example.

A resist mask having openings in the IGBT areas 3a and 3b is formed by photolithography on the polished second principal surface of the SiC support substrate. By the resist mask having openings in the IGBT areas 3a and 3b, the breakdown voltage structure 4a and the MOSFET area 2 are protected on the second principal surface side of the SiC support substrate. Anisotropic etching is performed by using the resist mask having openings in the IGBT areas 3a and 3b as a mask so as to form the concave portions 7a and 7b in the IGBT areas 3a and 3b, respectively.

The anisotropic etching for forming the concave portions 7a and 7b may be dry etching or wet etching using potassium chloride (KOH) solution etc. The anisotropic etching for forming the concave portions 7a and 7b makes the openings of the concave portions 7a and 7b wider than the bottom surfaces of the concave portions 7a and 7b. Therefore, the concave portions 7a and 7b have an obtuse angle as an angle formed by the bottom surface and side surface and have a cross-sectional shape with the side walls oblique to the bottom surface.

The etching depth from the polished second primary surface of the SiC support substrate for forming the concave portions 7a and 7b, i.e., the depth of the concave portions 7a and 7b is defined as a depth making the n-buffer layer 8 exposed on the bottom surfaces of the concave portions 7a and 7b. For example, the depth of the concave portions 7a and 7b may be about 75 μm, for example. The resist mask used for forming the concave portions 7a and 7b is then removed.

The polished second primary surface of the SiC support substrate including the concave portions 7a and 7b is entirely subjected to Al-doped epitaxial growth with a thickness of about 2 μm and an impurity concentration of $1 \times 10^{19}$ cm$^{-3}$. An Al-doped epitaxial layer is left only on the concave portions 7a and 7b in the IGBT areas 3a and 3b by using photolithography. As a result, the p$^+$-collector layers 9a and 9b of the IGBT cells are formed on the bottom surfaces of the concave portions 7a and 7b in the IGBT areas 3a and 3b. The p$^+$-collector layers 9a and 9b may be epitaxial layers grown on the surface of the n-buffer layer 8 exposed on the bottom surfaces of the concave portions 7a and 7b or may be semiconductor layers formed by ion implantation of p-type impurity into the n-buffer layer 8 exposed on the bottom surfaces of the concave portions 7a and 7b.

The insulating protection film protecting the first principal surface of the SiC substrate is removed and the passivation film 28 is formed by stacking a plurality of insulating films including a silicon dioxide (SiO$_2$) film across the first principal surface of the SiC substrate. A resist mask is formed with openings in the areas other than the formation area of the passivation film 28 by photolithography on the first principal surface of the SiC substrate.

The passivation film 28 formed on the first principal surface of the SiC substrate is selectively removed by using the resist mask having openings in the areas other than the formation area of the passivation film 28 as a mask. As a result, the passivation film 28 is left on the first principal surface of the SiC substrate in the breakdown voltage structure 4a.

An oxide film for the gate insulating films is formed across the first principal surface of the SiC substrate. A resist mask covering only the formation areas of the gate insulating films is formed by photolithography on the first principal surface of the SiC substrate. The oxide film for the gate insulating films formed on the first principal surface of the SiC substrate is selectively removed by using the resist mask covering only the formation areas of the gate insulating films as a mask to form the gate insulating films 16a, 16b, 26a, and 26b on the first principal surface of the SiC substrate. The thickness of the gate insulating films 16a, 16b, 26a, and 26b may be about 50 nm, for example.

The gate electrodes 17a, 17b, 27a, and 27b, the source electrode 15, and the emitter electrodes 25a and 25b are formed by, for example, a sputtering method, on the surfaces of the gate insulating films 16a, 16b, 26a, and 26b. The gate electrodes 17a, 17b, 27a, and 27b, the source electrode 15, and the emitter electrodes 25a and 25b may be formed of Al films, for example.

The Ti films 10a and 10b with a thickness of about 0.5 μm for contacts are respectively formed by, for example, a sputtering method, on the surfaces of the p$^+$-collector layers 9a and 9b of the IGBT cells formed in the concave portions 7a and 7b of the second principal surface of the SiC substrate. The Ni film 20a with a thickness of about 0.5 μm functioning as contact metal of the n-drain layer 6 of the MOSFET cell is formed on the surfaces of the Ti films 10a and 10b and the n-drain layer 6.

The Ni film 20a is formed entirely on the second principal surface of the SiC substrate from the surface of the convex portion 6b in the MOSFET area 2 making up the n-drain layer 6 across the bottom surfaces and the side walls of the concave portions 7a and 7b in the IGBT areas 3a and 3b and the convex portion 6a of the breakdown voltage structure 4a. The Au film 20b is formed with a thickness of 4 μm on the entire surface of the Ni film 20a to form the collector electrode 20 (also acting as the drain electrode of the MOSFET cells) formed by stacking the Ni film 20a and the Au film 20b and the combined switching device 1 depicted in FIGS. 1 to 4 is completed. The Ni film 20a may be disposed only on the surface of the convex portion 6a. In this case, the Au film 20b comes into contact with the p$^+$-collector layers 9a and 9b disposed on the bottom surfaces of the concave portions 7a and 7b in the IGBT areas 3a and 3b.

The operation and representative characteristics of the combined switching device 1 according to the first embodiment will be described along the operation at the time of an operation test of the combined switching device 1. First, the combined switching device 1 depicted in FIGS. 1 to 4 was fabricated and die-bonded to a TO-type (pin insertion type) package. A plurality of connecting Al wires was wire-bonded on the source electrode 15 made of Al. The diameter of the Al wires was 100 μm, for example. The whole of the first principal surface of the SiC substrate and the Al wires were covered with the insulating film for protecting the first principal surface of the SiC substrate to make the combined switching device 1 operable. For the insulating film for protecting the first principal surface of the SiC substrate, a nanotechnology resin was used that is a high heat-resistance resin. The operation test of the combined switching device 1 was then performed.

In the operation test of the combined switching device 1, first, a gate voltage greater than or equal to a threshold voltage was applied to the gate electrode 17 of the MOSFET cells and the gate electrodes 27a and 27b of the IGBT cells. A forward voltage is subsequently applied to the combined switching device 1. For example, the voltage was applied between the collector electrode 20, and the source electrode 15 and the emitter electrodes 25a and 25b such that the electric potential of the collector electrode 20 became higher than the electric potentials of the source electrode 15 and the emitter electrodes 25a and 25b. The forward output characteristics of the combined switching device 1 were measured. An on-current started flowing through the combined switching device 1 approximately when the applied voltage nearly reached near zero V.

Since the MOSFET cells are turned on by further increasing the forward applied voltage, the on-current of the combined switching device 1 substantially linearly increases. Subsequently, by further increasing the forward applied voltage, the on-current of the combined switching device 1 started drastically increasing approximately when the applied voltage reached near 2.7 V corresponding to the built-in voltage of the IGBT made of SiC. The reason is as follows. As the forward applied voltage is increased, the IGBT cells are turned on after the MOSFET cells are turned on, and the on-current due to the IGBT cells also flows through the combined switching device 1. As a result, a superimposed on-current of the on-current flowing due to turning-on of the IGBT cells and the on-current already flowing from the time of turning-on of the MOSFET cells flows through the combined switching device 1.

In the combined switching device 1, the on-resistance per unit area was about 145 mΩ-cm$^2$ when the applied voltage was less than or equal to the IGBT built-in voltage, and the on-resistance per unit area was about 16 mΩ-cm$^2$ when the applied voltage was greater than or equal to the IGBT built-in voltage. As a result, it was confirmed that the combined switching device 1 extremely favorably operated. Since the output can be extracted when the forward voltage less than or equal to the IGBT built-in voltage is applied in this way, the combined switching device 1 can significantly reduce an electric power loss.

While the gate voltage was not applied to the gate electrode 17 of the MOSFET and the gate electrodes 27a and 27b of the IGBT, the forward voltage was applied between the collector electrode 20, and the source electrode 15 and the emitter electrodes 25a and 25b. Although a leak current flowed, the combined switching device 1 exhibited favorable forward blocking characteristics and caused avalanche breakdown at the forward voltage near 11.3 kV at room temperature.

The leak current until causing the avalanche breakdown was less than or equal to $1\times10^{-4}$ A/cm$^2$ at room temperature and the average was on the order of $1.5\times10^{-5}$ A/cm$^2$ during the operation of the combined switching device 1. Therefore, it was confirmed that the leak current was not significantly increased. The leak current of the combined switching device 1 was less than or equal to $4.5\times10^{-3}$ A/cm$^2$ at high temperature of 250 degrees C., which is favorable. The turn-on time and the turn-off time of the combined switching device 1 are 220 ns and 450 ns, respectively, and the high-speed operation of the combined switching device 1 can be realized.

The combined switching devices 1 according to the first embodiment were formed in individual element areas of a three-inch diameter SiC wafer. For example, the convex portions 6a and 6b and the concave portions 7a and 7b were formed on the second principal surface of the SiC wafer. A thickness from the first principal surface of the SiC wafer to the convex portions 6a and 6b is 140 μm. A difference in height due to curvature between the outer peripheral end portion and the center portion of the SiC wafer (hereinafter, curvature height) was less than or equal to about 300 μm. The damages of the SiC wafer during the course of fabricating of the combined switching device 1 were limited to only a few and fell within the allowable range of the fabricating line of the combined switching devices 1.

The combined switching device 1 cut into a chip shape from the SiC wafer was favorable without significant increase in the leak current. When the combined switching device 1 cut into a chip shape was die-bonded and wire-bonded to the TO-type package, cracks and various defects were not generated due to mechanical stress and heat stress in the epitaxial layers such as the n$^-$-drift layer 11 and the n-buffer layer 8, especially, in the bottom corner portions of the concave portions 7a and 7b, of the combined switching device 1.

On the other hand, by way of comparison, combined switching devices not having the convex portions 6a and 6b and the concave portions 7a and 7b and therefore having a correspondingly reduced thickness was fabricated on a SiC wafer having the diameter and thickness same as the SiC wafer for fabricating the combined switching devices 1. The curvature height of the SiC wafer for fabricating the combined switching devices not having the convex portions 6a and 6b and the concave portions 7a and 7b was about 650 μm to 3500 μm. The damages of the SiC wafer frequently occurred during the course of fabricating of the combined switching devices not having the convex portions 6a and 6b and the concave portions 7a and 7b and exceeded the allowable range of the fabricating line of the combined switching devices 1.

An increase in the on-voltage was limited to 0.2 V or less in a 1000-hour energization test and no significant decrease in reliability was recognized in the combined switching devices 1. As a result, it was confirmed that the reliability of the combined switching devices 1 can be improved by preventing the internal resistance from increasing especially in the IGBT cells during energization due to stacking faults among the defects occurring in the epitaxial layers making up the combined switching device 1.

As described above, according to the first embodiment, when the IGBT and the MOSFET are disposed as described above, by applying the gate voltage to the gate electrodes 27a and 27b of the IGBT and the gate electrodes 17a and 17b of the MOSFET, the IGBT cannot be driven by the forward voltage less than or equal to the built-in voltage while the parallel-connected MOSFET can be driven from near zero V. Both elements of the IGBT and the MOSFET can be driven by the forward voltage greater than or equal to the IGBT built-in voltage. As a result, since the output can be extracted at the forward voltage less than or equal to the IGBT built-in voltage, the semiconductor device of the present invention can significantly reduce the electric power loss.

When the gate voltage is applied to the gate electrodes 27a and 27b of the IGBT and the gate electrodes 17a and 17b of the MOSFET, the combined switching devices 1 is driven and energized as a unipolar transistor between the emitter electrode 25 of the IGBT and the collector electrode 20 functioning as the drain electrode of the MOSFET even at the forward voltage less than or equal to the IGBT built-in voltage, the semiconductor device area can effectively be utilized. When the forward voltage greater than or equal to the IGBT built-in voltage is applied in the combined switching device 1, the IGBT is driven and carriers injected from the p$^+$-collector layer 9 of the IGBT flow into the n$^-$-drift layer 11 of the MOSFET, causing conductivity modulation. Therefore, the MOSFET is driven as a bipolar transistor. This enables the effective utilization of the area of the combined switching device 1.

Before the various electrodes of each of the IGBT and the MOSFET are formed, the SiC substrate is thinly processed from the second principal surface of the SiC substrate until the thickness of the n-drain layer 6 reaches 150 μm or less, preferably, 80 μm or less by a known technique such as polishing, grinding, and etching, for example. In the principal surface on the processed side of the SiC substrate, for example, the outer peripheral portion forms the convex portion 6a, and the concave portions 7a and 7b and the convex portion 6b are disposed such that the center portion has a plurality of protrusions/recesses. The breakdown voltage structure including an electric field relaxation layer such as the JTE 4 is disposed on the convex portion 6a of the outer peripheral portion of the SiC substrate. The IGBT is disposed on the concave portion 7b adjacent to the inside of the convex portion 6a of the outer peripheral portion of the SiC substrate, and the MOSFET is disposed on the convex portion 6b adjacent to the inside.

The concave portions 7a and 7b are disposed with a depth making the n-buffer layer 8 exposed on the bottom surfaces thereof. The p$^+$-collector layer 9 having a concentration higher than the n-buffer layer 8 is disposed on the surface of the n-buffer layer 8 exposed on the bottom surfaces of the concave portions 7a and 7b. The collector electrode 20 is formed on the surface of the p$^+$-collector layer 9. The collector electrode 20 functioning as the drain electrode of the MOSFET is disposed on at least a surface of the convex portion 6b. The collector electrode 20 functioning as the drain electrode of the MOSFET may be disposed across the surface and the side surfaces of the convex portion 6b. The collector electrode 20 of the IGBT is extended to the convex portion 6b of the MOSFET area 2 and the collector electrode 20 functions as a drain electrode in the MOSFET area 2.

When the combined switching device 1 has the structure described above, the n$^+$-emitter layers 23a and 23b and the n$^+$-source layer 13 in need of fine patterns for higher performance can be formed while the SiC support substrate acting as the n-drain layer 6 is thick. Therefore, the curvature of the SiC wafer during the course of fabricating of the combined switching device 1 can significantly be suppressed and fine patterns are easily formed by photo-etching etc. Additionally, the elements making up the combined switching device 1 formed on the SiC wafer can be prevented from being destroyed due to mechanical stress and heat stress and a multiplicity of defects can be prevented from occurring.

When the combined switching device 1 has the structure described above, the combined switching device 1 can be configured by using an n-type SiC support substrate without using a thick p-type SiC support substrate leading to the formation of a multiplicity of crystal defects. Since the n-type SiC support substrate is finally thinned to a thickness of 150 μm or less, preferably, 80 μm or less, the internal resistance can significantly be suppressed in the n-drain layer 6 portion consisting of the SiC support substrate. Since the refinement of elements can be achieved and the internal resistance can significantly be suppressed in the n-drain layer 6 portion consisting of the SiC support substrate as described above, the intrinsic high performance, i.e., the high speed and low loss of the combined switching device 1 made of the wide-gap semiconductor material can be fulfilled while the yield can be improved. Therefore, the economic efficiency can significantly be improved.

Since the p$^+$-collector layer 9 is formed on the bottom surface of the concave portion, the direct connection at the time of die bonding can be avoided between the package and the p$^+$-collector layer 9 having heat expansion coefficients significantly different from each other. Therefore, the direct application of heat stress and mechanical stress to the p$^+$-collector layer 9 can be prevented to significantly suppress the occurrence of cracks and defects. Since the SiC substrate is supported by bringing the convex portions 6a and 6b of the SiC substrate into contact with the package at the time of wire bonding of the SiC substrate, the significant alleviation can be achieved in the increase in stress applied to the concave portions 7a and 7b due to the mechanical stress applied for increasing a crimping force of wires, and the occurrence of cracks and defects can further be suppressed. Therefore, the leak current in the junction between the p$^+$-collector layer 9 and the n-buffer layer 8 can be restrained from increasing due to the occurrence of defects in the p$^+$-collector layer 9, and the performance of the bipolar transistor of the combined switching device 1 can be restrained from deteriorating.

As described above, the curvature of the SiC wafer can be suppressed that is generated during the course of fabricating of the combined switching device 1 due to the thinness of the SiC support substrate acting as the n-drain layer 6 and the thinness of the p$^+$-collector layer 9, and the heat stress and the mechanical stress to the SiC substrate can be suppressed that increases during the course of mounting of the combined switching device 1, thereby significantly reducing the occurrence of various defects such as stacking faults. As a result, the internal resistance of the combined switching device 1 can be restrained from increasing due to the stacking faults and the reliability can be improved.

The configuration equipped with the n-buffer layer 8 enables the employment of a "punch-through structure" capable of making the n$^-$-drift layer 11 thinner. Since a semiconductor device of the punch-through structure has a thinner depletion layer, when a backward voltage corresponding to a breakdown voltage is applied, the depletion layer spreads to the whole of the n$^-$-drift layer 11 and further spreads into the n-buffer layer 8 having an impurity concentration higher than the n$^-$-drift layer 11. However, the depletion layer can be terminated within the n-buffer layer 8 to ensure the breakdown voltage by forming the n-buffer layer 8 with a predetermined thickness and a predetermined impurity concentration.

As a result, the n$^-$-drift layer 11 can be made considerably thinner than a semiconductor device of the non-punch-through structure and, therefore, the internal resistance of the n$^-$-drift layer 11 can be reduced by the thinning of the n$^-$-drift layer 11 to decrease the electric power loss. The leak current drastically increased by thickening the n$^-$-drift layer can be reduced at the time of application of the backward voltage, and the yield is significantly increased. On the other hand, the deterioration of the forward voltage at the time of energization is also suppressed when the combined switching device 1 is turned on and the reliability can be improved. Since the excessive injection of carriers from the p$^+$-collector layer 9 can be suppressed, the residual carriers can be reduced when the combined switching device 1 is turned off and the turn-off time can be shortened to reduce the turn-off loss.

(Second Embodiment)

Figure 5:
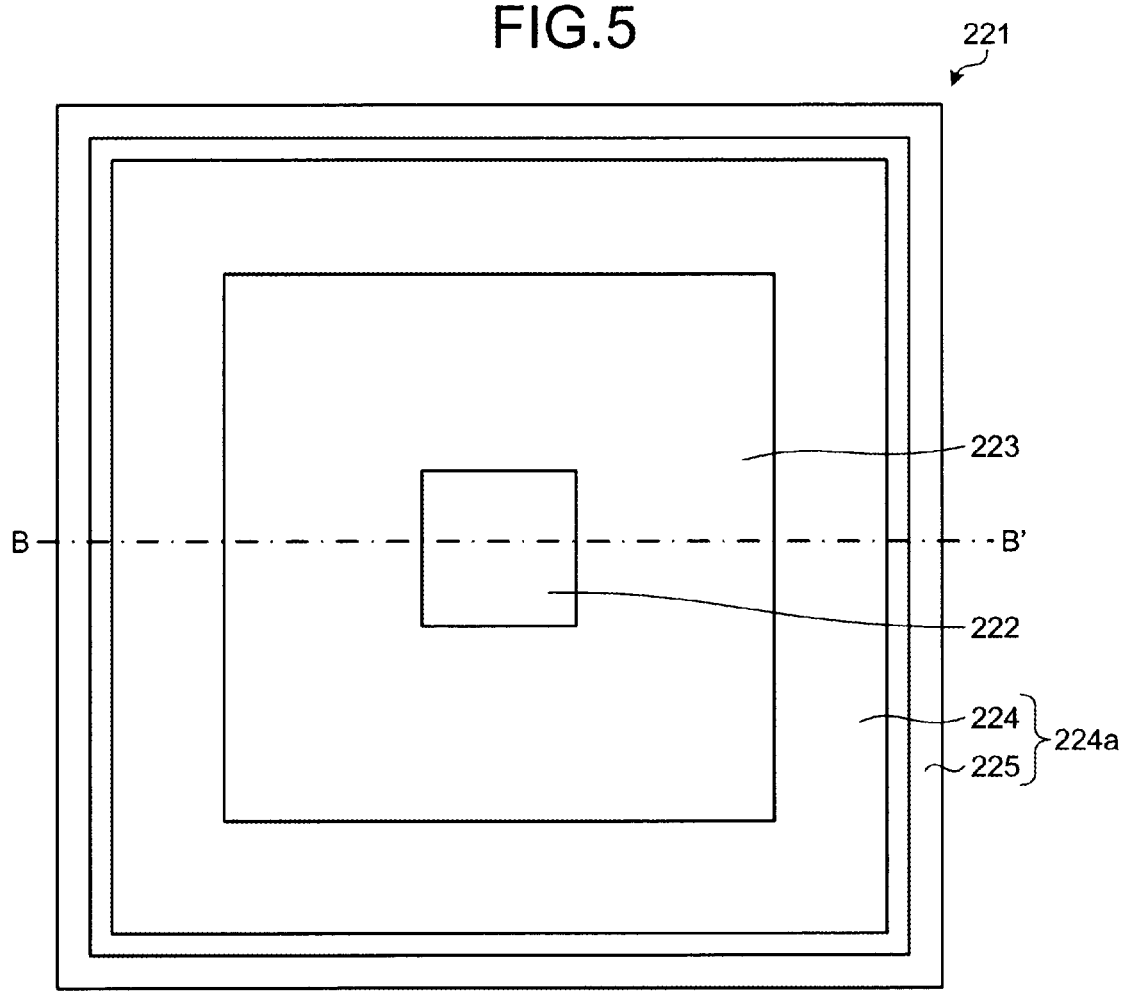
FIG. 5 is a plane view of a planar layout of a semiconductor device according to a second embodiment.

FIG. 5 is a plane view of a planar layout of a semiconductor device according to a second embodiment. The semiconductor device depicted in FIG. 5 is a combined switching device 221 having, for example, a 15-kV class breakdown voltage made up of a plurality of elements formed on the same SiC substrate made of 4H—SiC.

As depicted in FIG. 5, in the planar layout of the combined switching device 221, a MOSFET area 222 is disposed in a center portion of the SiC substrate as a formation area of a MOSFET made of wide-gap semiconductor. An IGBT area 223 is arranged as a formation area of an IGBT made of wide-gap semiconductor in contact with the MOSFET area 222, surrounding the MOSFET area 222.

In an outer peripheral portion of the SiC substrate, a JTE 224 and an n-channel stopper 225 are disposed as a breakdown voltage structure 224a. A MOSFET area 222 and an IGBT area 223 are surrounded by the breakdown voltage structure 224a. For example, the JTE 224 and the n-channel stopper 225 are disposed separately from each other in the breakdown voltage structure 224a. The JTE 224 surrounds the IGBT area 223. The n-channel stopper 225 surrounds the JTE 224.

The MOSFET area 222 is disposed with a MOSFET formed by connecting a plurality of MOSFET cells (not depicted) in parallel as is the case with the first embodiment. The IGBT area 223 is disposed with an IGBT formed by connecting a plurality of IGBT cells (not depicted) in parallel as is the case with the first embodiment. The planar shapes and the planar layouts of the MOSFET cells and the IGBT cells are the same the first embodiment. The planar shape of the combined switching device 221 is the same as the combined switching device of the first embodiment.

A main cross-sectional structure of the combined switching device 221 will be described. A cross-sectional structure taken along a cutting plane line B-B' of FIG. 5 is the same as the cross-sectional structure of the combined switching device (see FIG. 2) described in the first embodiment. The IGBT cells of the combined switching device 221 depicted in FIG. 5 are different from the IGBT cells of the first embodiment in that structural specifications are changed so as to achieve a 15-kV high breakdown voltage and that a $p^+$-collector layer 39 having substantially the same impurity concentration as the $p^+$-collector layers 9a and 9b of the first embodiment is formed by ion implantation of Al into the bottom surface of the concave portion 7b of the IGBT cells. The cross-sectional structure of the MOSFET cells and the cross-sectional structure of the IGBT cells of the combined switching device 221 are the same as the MOSFET cells and the IGBT cells of the first embodiment.

The combined switching device 221 has the following structural specifications for achieving the 15-kV high breakdown voltage. The n-buffer layer 8 is formed by epitaxial growth. The thickness and the impurity concentration of the n-buffer layer 8 may be, for example, about 13 μm and $6\times10^{16}$ cm$^{-3}$, respectively. The n$^-$-drift layer 11 is formed by epitaxial growth. The thickness and the impurity concentration of the n$^-$-drift layer 11 may be, for example, about 160 μm and $3\times10^{14}$ cm$^{-3}$, respectively.

The n-type resistance reduction layer 18 for JFET resistance reduction is formed by epitaxial growth. The thickness and the impurity concentration of the resistance reduction layer 18 may be, for example, about 1 μm and $6\times10^{15}$ cm$^{-3}$, respectively. The widths of the JTE 224 of the breakdown voltage structure 224a may be 650 μm in both the parallel element arrangement direction and the orthogonal element arrangement direction. The depth and the impurity concentration of the JTE 224 may be, for example, 1.3 μm and about $2\times10^{17}$ cm$^{-3}$, respectively.

The interval between the JTE 224 and the n-channel stopper 225 is 100 μm, for example. The impurity concentration of the n-channel stopper 225 is the same as the first embodiment. The depth of the concave portions 7a and 7b made up of the convex portions 6a and 6b and the concave portions 7a and 7b is, for example, about 70 μm and is in the same level as the first embodiment. As a result the thickness (hereinafter, overall thickness) of the combined switching device 221 from the first principal surface of the SiC substrate (surface on the n$^-$-drift layer 11 side of the SiC substrate) to the second principal surface of the SiC substrate (surface on the n-drain layer 6 side of the SiC substrate) is about 250 μm.

The operation and representative characteristics of the second embodiment will be described along the operation at the time of an operation test of the combined switching device 221. First, as is the case with the first embodiment, after the combined switching device 221 was die-bonded to a TO-type package, a plurality of connecting Al wires was wire-bonded on the source electrode 15 made of Al. The whole of the first principal surface of the SiC substrate and the Al wires were covered with an insulating film for protecting the first principal surface of the SiC substrate to make the combined switching device 1 operable. The insulating film for protecting the first principal surface of the SiC substrate was the same as the first embodiment. The operation test of the combined switching device 221 was then performed.

As is the case with the first embodiment, a gate voltage greater than or equal to a threshold voltage was applied to the gate electrode 17 of the MOSFET and the gate electrodes 27a and 27b of the IGBT to measure the forward output characteristics of the combined switching device 221. As is the case with the first embodiment, an on-current started flowing through the combined switching device 221 from the applied voltage near zero V. By further increasing the forward applied voltage, the on-current of the combined switching device 221 substantially linearly increases as is the case with the first embodiment. Subsequently, by further increasing the applied voltage, the on-current of the combined switching device 221 started drastically increasing approximately when a voltage near 2.7 V corresponding to the IGBT built-in voltage was applied. The reason is the same as the first embodiment.

In the combined switching device 221, the on-resistance per unit area was about 250 mΩ·cm$^2$ when the applied voltage was less than or equal to the IGBT built-in voltage, and the on-resistance per unit area was about 19 mΩ·cm$^2$ when the applied voltage was greater than or equal to the IGBT built-in voltage, which was extremely favorable. Since the output can be extracted from the combined switching device 221 even when the forward applied voltage is less than or equal to the IGBT built-in voltage in this way, the combined switching device 221 can significantly reduce the electric power loss.

While the gate voltage was not applied to the combined switching device 221, the forward voltage was applied between the collector electrode 20, and the source electrode 15 and the emitter electrodes 25a and 25b. Although a leak current flowed, the combined switching device 221 exhibited favorable forward blocking characteristics and caused avalanche breakdown at the forward voltage near 16.7 kV at room temperature. The leak current until causing the avalanche breakdown was less than or equal to $3\times10^{-3}$ A/cm$^2$ at room temperature and was $4\times10^{-2}$ A/cm$^2$ at high temperature of 250 degrees C., which was favorable. The turn-on time and the turn-off time of the combined switching device 221 are 270 ns and 520 ns, respectively, and it is confirmed that the high-speed operation of the combined switching device 221 can be realized.

The combined switching device 221 according to the second embodiment has an overall thickness thicker than the combined switching device according to the first embodiment. Therefore, a curvature height of a three-inch diameter SiC wafer is less than or equal to about 250 μm. The damages of the SiC wafer during the course of fabricating of the combined switching device 221 were limited to a smaller number than the combined switching devices 1 according to the first embodiment. An increase in the on-voltage was limited to 0.15 V or less in a 1000-hour energization test and no significant decrease in reliability was recognized in the combined switching devices 221.

As described above, according to the second embodiment, the same effects as the first embodiment can be acquired.

(Third Embodiment)

Figure 6:
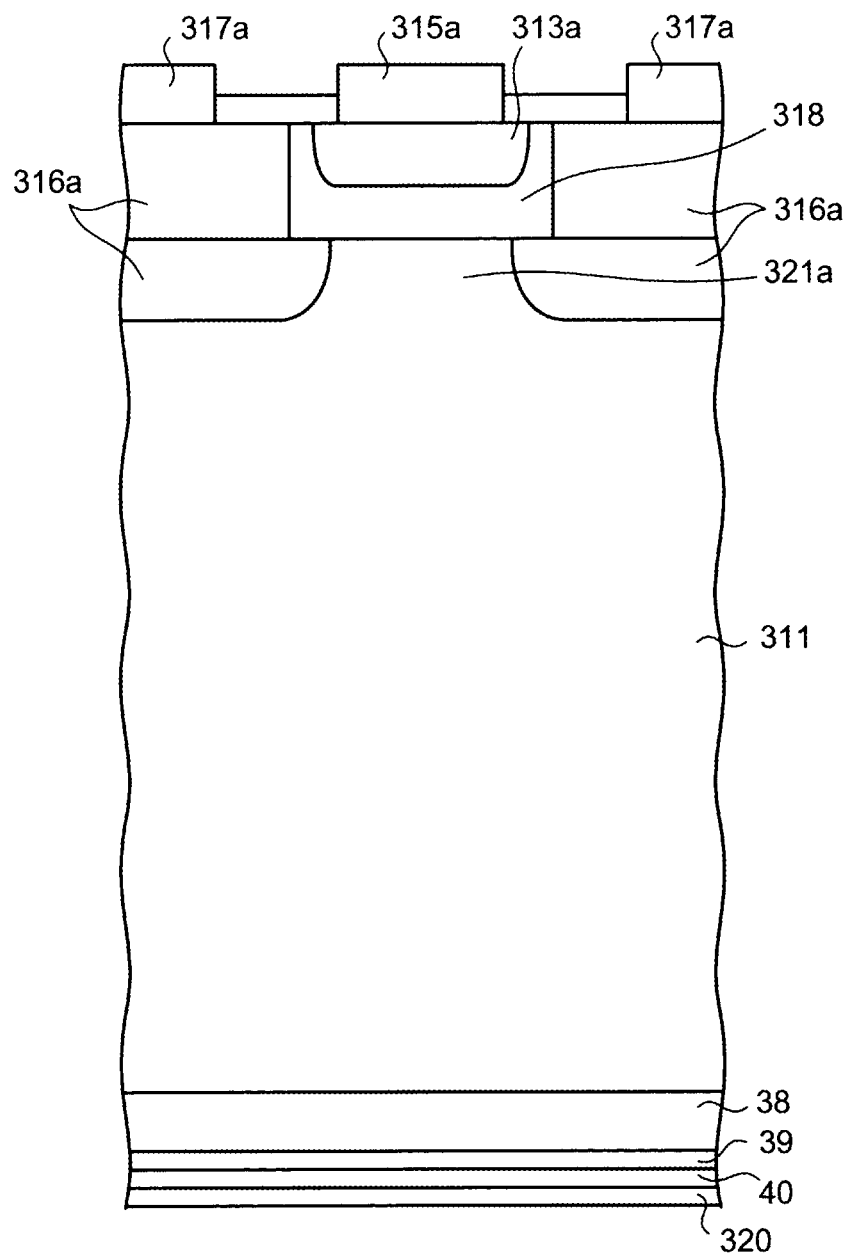
FIG. 6 is a cross-sectional view of relevant portions of semiconductor devices according to a third embodiment.
Figure 7:
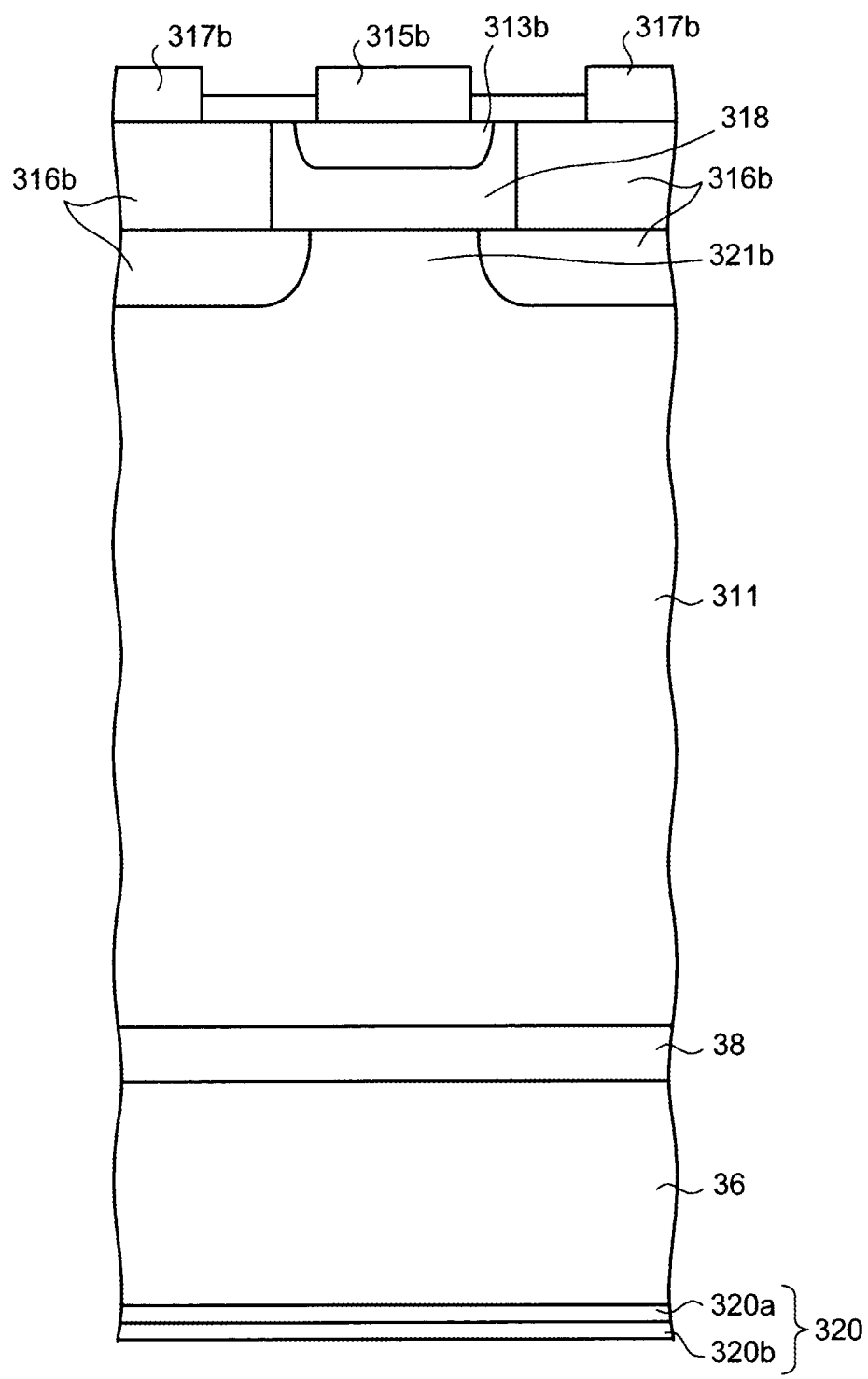
FIG. 7 is a cross-sectional view of relevant portions of semiconductor devices according to the third embodiment.

FIGS. 6 and 7 are cross-sectional views of relevant portions of semiconductor devices according to a third embodiment. Each of the semiconductor devices depicted in FIGS. 6 and 7 is an element formed on the same SiC substrate made of 4H—SiC and making up a combined switching device having a 10-kV class breakdown voltage, for example. The combined switching device according to the third embodiment is disposed with a static induction transistor (SIT) depicted in FIG. 7 and a bipolar-mode statistic induction transistor (BSIT) depicted in FIG. 6 instead of the MOSFET and the IGBT of the combined switching device according to the first embodiment.

In the planar layout of the combined switching device according to the third embodiment, a SIT area is located in the center portion of the SiC substrate as a formation area of a static induction transistor (SIT) that is a unipolar transistor made of wide-gap semiconductor. BSIT areas are arranged as formation areas of bipolar-mode statistic induction transistors (BSITs) that are bipolar transistors made of wide-gap semiconductor, in contact with the SIT area, sandwiching the SIT area. The BSITs do not have the self-maintenance function of thyristor and therefore correspond to bipolar transistors.

In the outer peripheral portion of the SiC substrate, a JTE and an n-channel stopper are disposed separately from each other as a breakdown voltage structure. The JTE surrounds the SIT area and the BSIT areas. The n-channel stopper surrounds the JTE. In other words, the planar layout of the SIT area, the BSIT areas, the JTE, and the re-channel stopper of the third embodiment is the same as the planar layout of the MOSFET area, the IGBT areas, the JTE, and the n-channel stopper of the first embodiment (see FIG. 1).

Gate electrodes of the SIT disposed in the SIT area and the BSITs disposed in the BSIT areas are electrically connected to each other (not depicted). A source electrode of the SIT disposed in the SIT area and emitter electrodes of the BSITs disposed in the BSIT areas are electrically connected (not depicted). A drain electrode of the SIT disposed in the SIT area and collector electrodes of the BSITs disposed in the BSIT areas are electrically connected (not depicted).

The SIT area is disposed with the SIT formed by connecting a plurality of SIT cells in parallel. Gate electrodes, source electrodes, and drain electrodes of a plurality of the SIT cells are respectively electrically connected. The planar shape, dimensions, and planar layout of the SIT cells are the same as the MOSFET cells of the first embodiment.

The BSIT areas are disposed with the BSITs formed by connecting a plurality of BSIT cells in parallel. Gate electrodes, emitter electrodes, and collector electrodes of a plurality of the BSIT cells are respectively electrically connected. The planar shape, dimensions, and planar layout of the BSIT cells are the same as the IGBT cells of the first embodiment.

As is the case with the first embodiment, a SiC substrate with the SIT cells and the BSIT cells formed is formed by stacking an n-drain layer 36 of the SIT cells, an n-buffer layer 38 consisting of an epitaxial layer, and an n⁻-drift layer 311 consisting of an epitaxial layer. Concave portions and convex portion are disposed on the second principal surface side (the n-drain layer 36 side) of the SiC substrate as is the case with the first embodiment. The BSIT areas are disposed at positions corresponding to the concave portions of the SiC substrate and the SIT is disposed at a position corresponding to the convex portion.

The cross-sectional structure of the BSIT cells will be described. The BSIT cell depicted in FIG. 6 is disposed in the BSIT areas. In the BSIT areas, for example, an epitaxial layer acting as an n-type resistance reduction layer 318 is formed on the first principal surface of the SiC substrate (the surface of the n⁻-drift layer 311). The resistance reduction layer 318 has an impurity concentration higher than the n⁻-drift layer 311. An n⁺-emitter layer 313a is selectively disposed on a surface layer of the resistance reduction layer 318. The n+-emitter layer 313a has an impurity concentration higher than the resistance reduction layer 318.

A p-type gate layer (hereinafter, p-junction gate layer, a ninth semiconductor layer) 316a is disposed, penetrating the resistance reduction layer 318 and reaching the surface layer of the n⁻-drift layer 311. The p-junction gate layer 316a is disposed separately from the n⁺-emitter layer 313a. An emitter electrode 315a is in contact with the n⁺-emitter layer 313a. A gate electrode 317a is in contact with the p-junction gate layer 316a. The gate electrode 317a is insulated from the n⁺-emitter electrode 315a by an interlayer insulating film (not depicted). Therefore, the BSIT has a gate structure with the gate electrode 317a disposed in contact with the p-junction gate layer 316a.

In the BSIT area, the concave portion is disposed on the second principal surface of the SiC substrate and the n-buffer layer 38 is exposed. In FIG. 6, the second principal surface of the SiC substrate is the bottom surface of the concave portion and the side walls of the concave portion are not depicted (hereinafter, only the bottom surface of the concave portion will be depicted in the same way in a cross-sectional view of an element depicted in FIG. 8). On the surface of the n-buffer layer 38, a collector electrode 320 consisting of the p⁺-collector layer 39, a Ti film 40, an Ni film, and an Au film is disposed as is the case with the IGBT cell of the first embodiment.

A cross-sectional cell of the SIT will be described. The SIT cell depicted in FIG. 7 is disposed in the SIT area.

The cross-sectional structure of the SIT cell has the same cross-sectional structure as the top surface element structure of the BSIT cell except the n-drain layer 36. For example, an n⁺-source layer 313b, a p-junction gate layer (tenth semiconductor layer) 316b, a source electrode 315b, and a gate electrode 317b of the SIT cell have the same configurations as the n⁺-emitter layer 313a, the p-junction gate layer 316a, the emitter electrode 315a, and the gate electrode 317a of the BSIT cell depicted in FIG. 6. Therefore, the SIT has a gate structure with the gate electrode 317b disposed in contact with the p-junction gate layer 316a.

In the SIT area, the convex portion acting as the n-drain layer 36 is formed on the second principal surface of the SiC substrate. In FIG. 7, the second principal surface of the SiC substrate is the surface of the convex portion and the side walls of the convex portion are not depicted (hereinafter, only the surface of the convex portion will be depicted in the same way in a cross-sectional view of an element depicted in FIG. 9). On the surface of the n-drain layer 36, the collector electrode 320 consisting of an Ni film 320a and an Au film 320b is disposed as is the case with the MOSFET cell of the first embodiment. The structure of the combined switching device according to the third embodiment other than the cross-sectional structure of the SIT cell and the cross-sectional structure of the BSIT cell is the same as the combined switching device according to the first embodiment.

The combined switching device according to the third embodiment is a normally-off type device and, while no gate voltage is applied to the gate electrode 317a of the BSIT cell and the gate electrode 317b of the SIT cell, even if a forward voltage is applied between the collector electrode 320, and the emitter electrode 315a and the source electrode 315b, only a leak current flows and an on-current does not flow. The reason is as follows.

This is because while no gate voltage is applied, a channel 321a formed in the n⁻-drift layer 311 below the n⁺-emitter layer 313a is pinched off by a depletion layer extended from the p-junction gate layer 316a in the BSIT cell. Additionally, this is because a channel 321b formed in the n⁻-drift layer 311 below the n⁺-source layer 313b is pinched off by a depletion layer extended from the p-junction gate layer 316b in the SIT cell.

The operation and representative characteristics of the combined switching device according to the third embodiment will be described. First, as is the case with the first embodiment, after the combined switching device was die-bonded to a TO-type package, a plurality of connecting Al wires was wire-bonded on the emitter electrode 315a and the source electrode 315b. The leak current of the combined switching device according to the third embodiment was less than or equal to $5 \times 10^{-3}$ A/cm² at room temperature when the forward voltage of 10 kV is applied, and the average was on the order of $8 \times 10^{-5}$ A/cm² during the operation of the combined switching device. The leak current of the combined switching device according to the third embodiment was less than or equal to $8 \times 10^{-2}$ A/cm² at high temperature of 250 degrees C., which was favorable. The combined switching device according to the third embodiment caused avalanche breakdown at an applied voltage near 10.8 kV at room temperature and it was confirmed that a high breakdown voltage can be realized.

A gate voltage less than or equal to the built-in voltage of 2.7 V of the BSIT was applied to the gate electrodes 317a and 317b and a voltage (forward voltage) was applied between the collector electrode 320, and the emitter electrode 315a and the source electrode 315b such that a forward state is achieved in which the electric potential of the collector electrode 320 is higher than the electric potentials of the emitter electrode 315a and the source electrode 315b, so as to measure the forward output characteristics of the combined switching device. As is the case with the first embodiment, an on-current started flowing through the combined switching device from the applied voltage near zero V. Since the SIT was turned on by further increasing the forward applied voltage, the on-current of the combined switching device substantially linearly increased as is the case with the first embodiment.

Subsequently, by further increasing the forward applied voltage, the on-current of the combined switching device started drastically increasing when a voltage near 2.7 V corresponding to the BSIT built-in voltage was applied. The reason is as follows. As the forward applied voltage is increased, the BSIT is turned on after the SIT is turned on. Because the BSIT is also turned on, the holes in the p⁺-collector layer 39 are injected from the p⁺-collector layer 39 via the n-buffer layer 38 into the n⁻-drift layer 311, causing conductivity modulation. As a result, the internal resistance of the n⁻-drift layer 311 is reduced and, therefore, a large amount of the on-current flows through the n⁻-drift layer 311 in a superimposed manner. This leads to the drastic increase in the on-current of the combined switching device.

In the combined switching device according to the third embodiment, the on-resistance per unit area was about 125 mΩ-cm² when the applied voltage was less than or equal to the BSIT built-in voltage, and the on-resistance per unit area was about 19 mΩ-cm² when the applied voltage was greater than or equal to the BSIT built-in voltage, which is extremely favorable.

When the gate voltage is set to 2.7 V or greater in the combined switching device according to the third embodiment, the on-current of the combined switching device significantly increases regardless of whether the forward voltage is less than or equal to the built-in voltage of the BSIT or greater than or equal to the built-in voltage. This is because the gate junction formed of the p-junction gate layers 316a and 316b and the n⁻-drift layer 311 is built in and the holes in the p-junction gate layers 316a and 316b are injected from the p-junction gate layers 316a and 316b into the n⁻-drift layer 311, further promoting the conductivity modulation in the n⁻-drift layer 311.

As a result, in the combined switching device according to the third embodiment, the on-resistance per unit area was about 75 mΩ-cm² when the applied voltage was less than or equal to the BSIT built-in voltage, and the on-resistance per unit area was about 11 mΩ-cm² when the applied voltage was greater than or equal to the BSIT built-in voltage. Therefore, it was confirmed that the on-resistance of the combined switching device can further significantly be reduce. As a result, since the greater output can be extracted as compared to the combined switching device according to the first embodiment even when the forward voltage less than or equal to the BSIT built-in voltage is applied, the combined switching device according to the third embodiment can further significantly reduce the electric power loss. The turn-on time and the turn-off time of the combined switching device according to the third embodiment are 205 ns and 350 ns, respectively, and the high-speed operation of the combined switching device can be realized.

The curvature height of the three-inch diameter SiC wafer for forming the combined switching device according to the third embodiment was measured. The curvature height of the SiC wafer is less than or equal to about 300 μm as is the case with the first embodiment. The damages of the SiC wafer during the course of fabricating of the combined switching device according to the third embodiment were limited to only a few and fell within the allowable range of the fabricating line of the combined switching devices.

The leak current was not significantly increased and was favorable before and after die-bonding and wire-bonding of the combined switching device according to the third embodiment to the TO-type package. Increases in on-current and on-voltage were limited to 50 A/cm² and 0.2 V or less, respectively, in a 1000-hour energization test. Therefore, in the combined switching device according to the third embodiment, no significant reduction in reliability was confirmed due to an increase in stacking faults etc., occurring in the epitaxial layers making up the combined switching device.

As described above, according to the third embodiment, the same effects as the first embodiment can be acquired.

(Fourth Embodiment)

Figure 8:
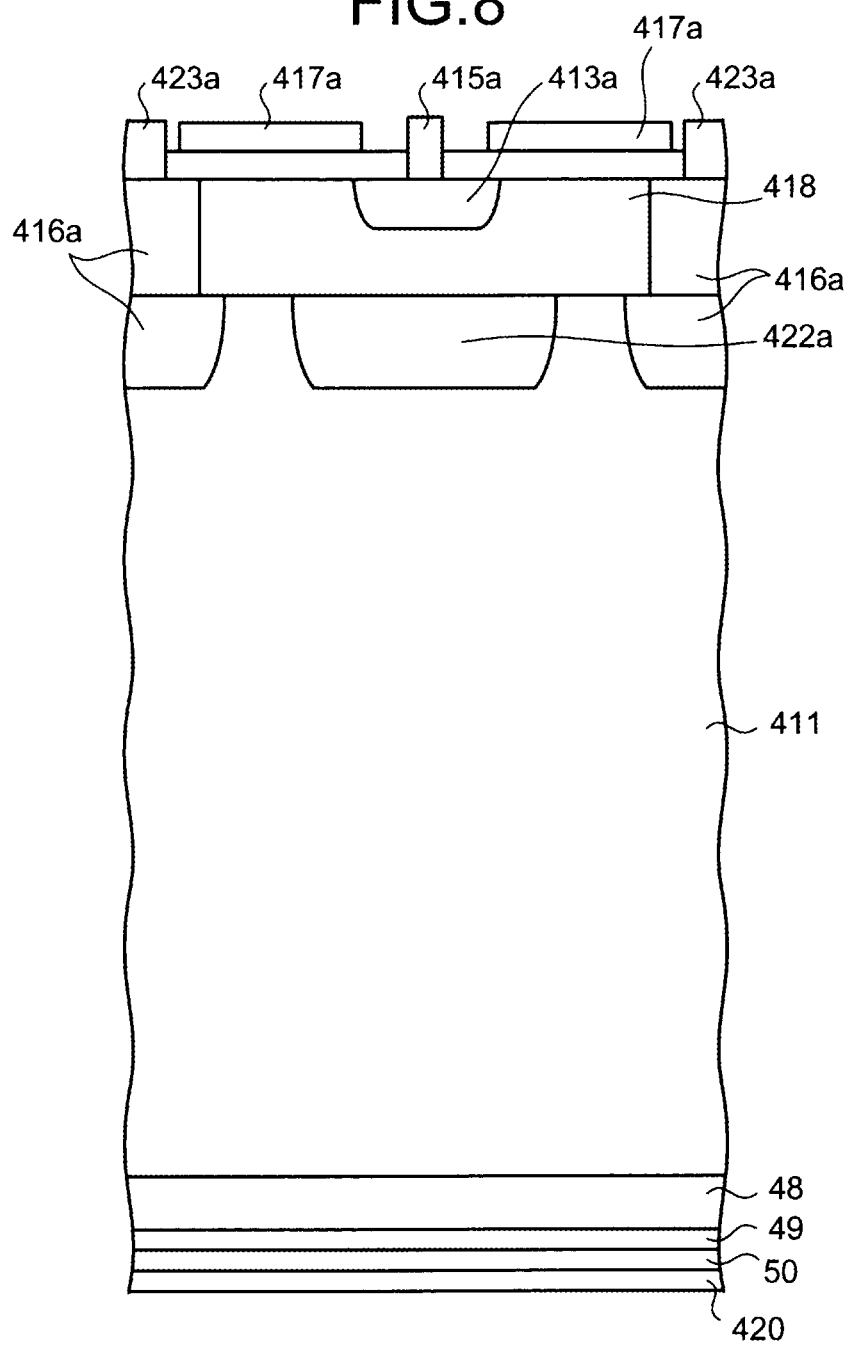
FIG. 8 is a cross-sectional view of relevant portions of semiconductor devices according to a fourth embodiment.
Figure 9:
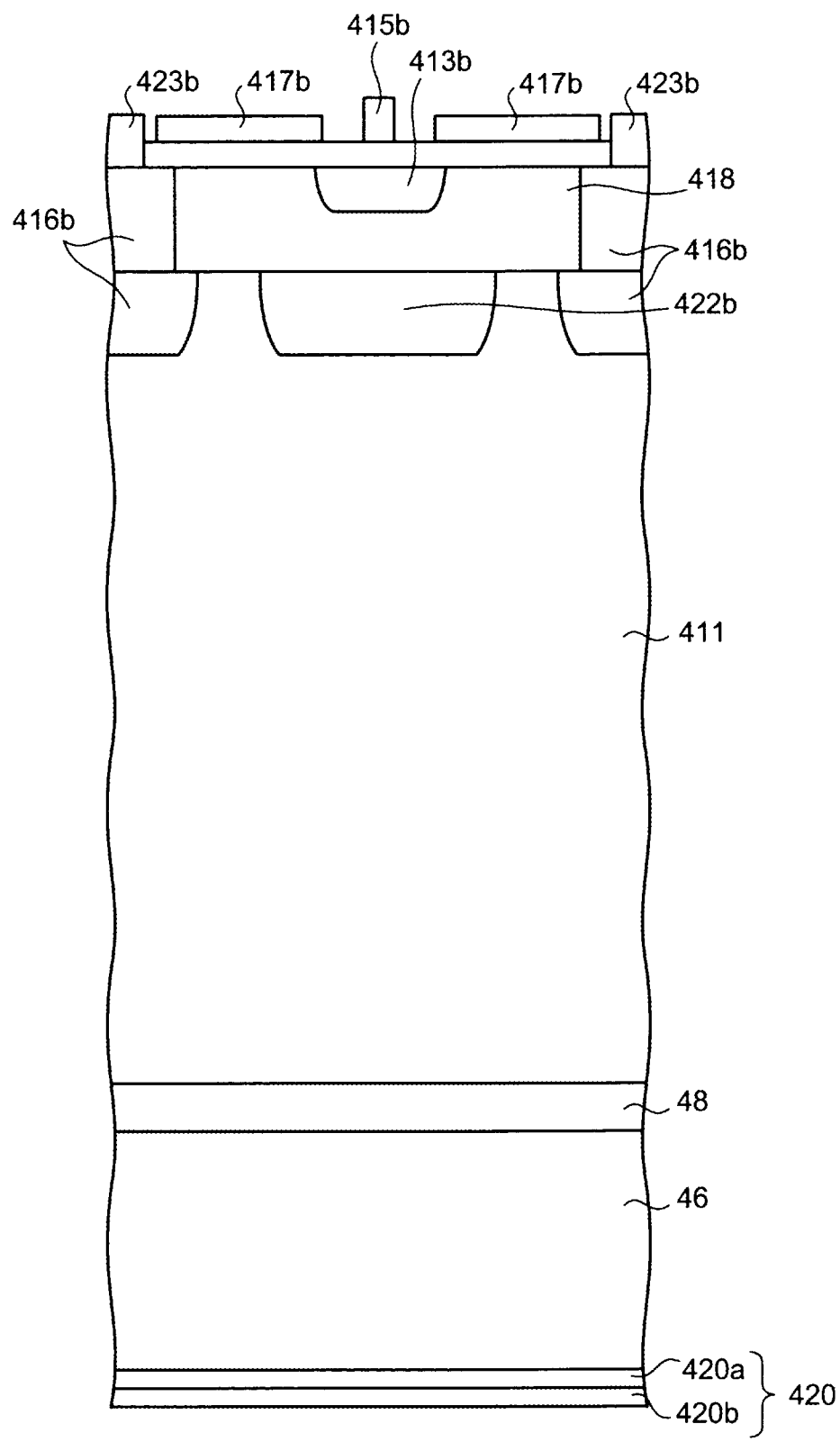
FIG. 9 is a cross-sectional view of relevant portions of semiconductor devices according to the fourth embodiment.

FIGS. 8 and 9 are cross-sectional views of relevant portions of semiconductor devices according to a fourth embodiment. Each of the semiconductor devices depicted in FIGS. 8 and 9 is an element formed on the same SiC substrate made of 4H—SiC and making up a combined switching device having a 10-kV class breakdown voltage, for example. The combined switching device according to the fourth embodiment is disposed with a MOS-type SIAFET (MOS-SIAFET: MOS-Static induction Injected Accumulated FET) depicted in FIG. 9 and a bipolar-type SIAFET (BSIAFET: Bipolar Static induction Injected Accumulated FET) depicted in FIG. 8 instead of the MOSFET and the IGBT of the combined switching device according to the first embodiment.

In the planar layout of the combined switching device according to the fourth embodiment, a MOS-SIAFET area is located in the center portion of the SiC substrate as a formation area of a MOS-type SIAFET (MOS-SIAFET) that is a unipolar transistor made of wide-gap semiconductor. BSIAFET areas are arranged as formation areas of bipolar-type SIAFETs (BSIAFETs) that are bipolar transistors made of wide-gap semiconductor, in contact with the MOS-SIAFET area, sandwiching the MOS-SIAFET area.

In the outer peripheral portion of the SiC substrate, a JTE and an n-channel stopper are disposed separately from each other as a breakdown voltage structure. The JTE surrounds the MOS-SIAFET area and the BSIAFET areas. The n-channel stopper surrounds the JTE. In other words, the planar layout of the MOS-SIAFET area, the BSIAFET areas, the JTE, and the n-channel stopper of the fourth embodiment are the same as the planar layout of the MOSFET area, the IGBT areas, the JTE, and the n-channel stopper of the first embodiment (see FIG. 1).

Gate electrodes of the MOS-SIAFET disposed in the MOS-SIAFET area and the BSIAFETs disposed in the BSIAFET areas are electrically connected to each other (not depicted). A source electrode of the MOS-SIAFET disposed in the MOS-SIAFET area and emitter electrodes of the BSIAFETs disposed in the BSIAFET areas are electrically connected (not depicted). A drain electrode of the MOS-SIAFET disposed in the MOS-SIAFET area and collector electrodes of the BSIAFETs disposed in the BSIAFET areas are electrically connected (not depicted).

The MOS-SIAFET area is disposed with the MOS-SIAFET formed by connecting a plurality of MOS-SIAFET cells in parallel. Gate electrodes, source electrodes, and drain electrodes of a plurality of the MOS-SIAFET cells are respectively electrically connected. The planar shape, dimensions, and planar layout of the MOS-SIAFET cells are the same as the MOSFET cells of the first embodiment.

The BSIAFET areas are disposed with the BSIAFETs formed by connecting a plurality of BSIAFET cells in parallel. The planar shape, dimensions, and planar layout of the BSIAFET cells are the same as the IGBT cells of the first embodiment. Gate electrodes, emitter electrodes, and collector electrodes of a plurality of the BSIAFET cells are respectively electrically connected.

As is the case with the first embodiment, a SiC substrate with the MOS-SIAFET cells and the BSIAFET cells formed is formed by stacking an n-drain layer 46 of the MOS-SIAFET cells, an n-buffer layer 48 consisting of an epitaxial layer, and an n$^-$-drift layer 411 consisting of an epitaxial layer. Concave portions and convex portion are disposed on the second principal surface side (the n-drain layer 46 side) of the SiC substrate as is the case with the first embodiment. The BSIAFET areas are disposed at positions corresponding to the concave portions of the SiC substrate and the MOS-SIAFET area is disposed at a position corresponding to the convex potion.

The cross-sectional structure of the BSIAFET cells will be described. The BSIAFET cell depicted in FIG. 8 is disposed in the BSIAFET areas. In the BSIAFET areas, for example, an epitaxial layer acting as an n-type resistance reduction layer 418 is formed on the first principal surface of the SiC substrate (the surface of the n$^-$-drift layer 411). The resistance reduction layer 418 has an impurity concentration higher than the n$^-$-drift layer 411. An n$^+$-emitter layer 413a is selectively disposed on a surface layer of the resistance reduction layer 418. The n$^+$-emitter layer 413a has an impurity concentration higher than the resistance reduction layer 418.

A p-type gate layer (p-junction gate layer, the ninth semiconductor layer) 416a is disposed, penetrating the resistance reduction layer 418 and reaching the surface layer of the n$^-$-drift layer 411. The p-junction gate layer 416a is disposed separately from the n$^+$-emitter layer 413a. A p-type gate layer (hereinafter, p-buried gate layer) 422a is disposed in the n$^-$-drift layer 411 below the n$^+$-emitter layer 413a.

The p-buried gate layer 422a is disposed separately from the p-junction gate layers 416a between the adjacent p-junction gate layers 416a selectively disposed on the first primary surface side of the SiC substrate. Therefore, the BSIAFET has a gate structure with the gate electrode 417a disposed in contact with the p-junction gate layer 416a and with the p-buried gate layer 422a disposed between the adjacent p-junction gate layers 416a and below the n$^+$-emitter layer 413a.

A gate electrode (hereinafter, a first gate electrode) 417a disposed via a gate insulating film on the first principal surface of the SiC substrate covers the resistance reduction layer 418 exposed on the first principal surface of the SiC substrate between the n$^+$-emitter layer 413a and the p-junction gate layer 416a. A gate electrode (hereinafter, a second gate electrode) 423a disposed on the first principal surface of the SiC substrate is in contact with the p-junction gate layers 416a.

The second gate electrode 423a is insulated from the first gate electrode 417a by an interlayer insulating film (not depicted). An emitter electrode 415a is in contact with the n$^+$-emitter layer 413a. The emitter electrode 415a is insulated from the first gate electrode 417a by an interlayer insulating film (not depicted). Therefore, the BSIAFET has a gate structure with the gate electrode 417a disposed in contact with the p-junction gate layer 416a and with the p-buried gate layer 422a disposed between the adjacent p-junction gate layers 416a and below the n$^+$-emitter layer 413a.

In the BSIAFET area, the concave portion is disposed on the second principal surface of the SiC substrate and the n-buffer layer 48 is exposed. On the surface of the n-buffer layer 48, a collector electrode 420 consisting of a p$^+$-collector layer 49, a Ti film 50, an Ni film, and an Au film is disposed as is the case with the IGBT cell of the first embodiment.

A cross-sectional structure of the MOS-SIAFET cells will be described. The MOS-SIAFET cell depicted in FIG. 9 is disposed in the MOS-SIAFET area. The cross-sectional structure of the MOS-SIAFET cell has the same cross-sectional structure as the BSIAFET cell except the n-drain layer 46. For example, an n$^+$-source layer 413b, a p-junction gate layer (the tenth semiconductor layer) 416b, a source electrode 415b, a first gate electrode 417b, and a second gate electrode 423b of the MOS-SIAFET cell have the same configurations as the n$^+$-emitter layer 413a, the p-junction gate layer 416a, the emitter electrode 415a, and the first gate electrode 417a, and the second gate electrode 423a of the BSIAFET cell depicted in FIG. 8.

In the MOS-SIAFET area, the convex portion acting as the n-drain layer 46 is formed on the second principal surface of the SiC substrate. On the surface of the n-drain layer 46, the collector electrode 420 consisting of an Ni film 420a and an Au film 420b is disposed as is the case with the MOSFET cell of the first embodiment. The structure of the combined switching device according to the fourth embodiment other than the cross-sectional structure of the MOS-SIAFET cell and the cross-sectional structure of the BSIAFET cell is the same as the combined switching device according to the first embodiment.

The combined switching device according to the fourth embodiment is a normally-off type device and, while no gate voltage is applied to the gate electrode 417a and the gate electrode 417b of the MOS-SIAFET cell, even if a forward voltage is applied between the collector electrode 420, and the emitter electrodes 415a and 415b, only a leak current flows and an on-current does not flow. The reason is as follows.

This is because while no gate voltage is applied, a channel formed between the $n^+$-emitter layer 413a, and the p-junction gate layer 416a and the p-buried gate layer 422a is pinched off by a depletion layer extended from the p-junction gate layer 416a and the p-buried gate layer 422a in the BSIAFET. Additionally, this is because a channel formed between the $n^+$-emitter layer 413b, and the p-junction gate layer 416b and the p-buried gate layer 422b is pinched off by a depletion layer extended from the p-junction gate layer 416b and the p-buried gate layer 422b in the MOS-SIAFET.

The operation and representative characteristics of the combined switching device according to the fourth embodiment will be described. First, as is the case with the first embodiment, after the combined switching device was die-bonded to a TO-type package, a plurality of connecting Al wires was wire-bonded on the emitter electrodes 415a and 415b. The leak current of the combined switching device according to the fourth embodiment was less than or equal to $5 \times 10^{-3}$ A/cm$^2$ at room temperature when the forward voltage of 10 kV is applied, and the average was $3 \times 10^{-5}$ A/cm$^2$ during the operation of the combined switching device. The leak current of the combined switching device according to the fourth embodiment was $6 \times 10^{-2}$ A/cm$^2$ at high temperature of 250 degrees C., which was favorable. The combined switching device according to the fourth embodiment caused avalanche breakdown at an applied voltage near 12.1 kV at room temperature and it was confirmed that a high breakdown voltage can be realized.

A gate voltage greater than or equal to the threshold voltage was applied to the gate electrodes 417a and 417b and a voltage (forward voltage) was applied between the collector electrode 420, and the emitter electrodes 415a and 415b such that a forward state is achieved in which the electric potential of the collector electrode 420 is higher than the electric potentials of the emitter electrodes 415a and 415b, so as to measure the forward output characteristics of the combined switching device. As is the case with the first embodiment, an on-current started flowing through the combined switching device from the applied voltage near zero V. By further increasing the forward applied voltage, the on-current of the combined switching device substantially linearly increased as is the case with the first embodiment. This is because the pinch-off by the depletion layer is canceled in association with the increase in the gate voltage; the MOS-SIAFET is turned on; and a channel width is increased in association with the increase in the gate voltage.

Subsequently, by further increasing the forward applied voltage, the on-current of the combined switching device started drastically increasing approximately when a voltage near 2.7 V corresponding to the BSIAFET built-in voltage was applied. The reason is as follows. As the forward applied voltage is increased, the BSIAFET is turned on after the MOS-SIAFET is turned on. Because the BSIAFET is also turned on, the holes in the $p^+$-collector layer 49 are injected from the $p^+$-collector layer 49 via the n-buffer layer 48 into the $n^-$-drift layer 411, causing conductivity modulation. As a result, the internal resistance of the $n^-$-drift 411 is reduced and, therefore, a large amount of the on-current flows through the $n^-$-drift 411 in a superimposed manner. This leads to the drastic increase in the on-current of the combined switching device.

In the combined switching device according to the fourth embodiment, the on-resistance per unit area was about 128 mΩ-cm$^2$ when the applied voltage was less than or equal to the BSIAFET built-in voltage, and the on-resistance per unit area was about 21 mΩ-cm$^2$ when the applied voltage was greater than or equal to the BSIAFET built-in voltage, which is extremely favorable.

When a voltage is applied to the second gate electrodes 423a and 423b and is set to 2.7 V or greater in the combined switching device according to the fourth embodiment, the on-current significantly increases regardless of whether the forward voltage is less than or equal to the built-in voltage of the BSIAFET or greater than or equal to the built-in voltage as is the case with the combined switching device according to the third embodiment. This is because the gate junction formed of the p-junction gate layers 416a and 416b and the $n^-$-drift layer 411 is built in as is the case with the combined switching device according to the third embodiment and the holes in the p-junction gate layers 416a and 416b are injected from the p-junction gate layers 416a and 416b into the $n^-$-drift layer 411, further promoting the conductivity modulation in the $n^-$-drift layer 411.

As a result, in the combined switching device according to the fourth embodiment, the on-resistance per unit area was about 82 mΩ-cm$^2$ when the applied voltage was less than or equal to the BSIAFET built-in voltage, and the on-resistance per unit area was about 13.5 mΩ-cm$^2$ when the applied voltage was greater than or equal to the BSIAFET built-in voltage. Therefore, it was confirmed that the on-resistance of the combined switching device can significantly be reduce as compared to the combined switching device according to the first embodiment.

As a result, since the greater output can be extracted as compared to the combined switching device according to the first embodiment even when the forward voltage less than or equal to the BSIAFET built-in voltage is applied, the combined switching device according to the fourth embodiment can significantly reduce the electric power loss. The turn-on time and the turn-off time of the combined switching device according to the fourth embodiment are 180 ns and 320 ns, respectively, and the high-speed operation of the combined switching device can be realized.

The curvature height of the three-inch diameter SiC wafer for forming the combined switching device according to the fourth embodiment was measured. The curvature height of the SiC wafer is less than or equal to about 300 μm as is the case with the first embodiment. The damages of the SiC wafer during the course of fabricating of the combined switching device according to the fourth embodiment were limited to only a few and fell within the allowable range of the fabricating line of the combined switching devices.

The leak current was not significantly increased and was favorable before and after die-bonding and wire-bonding of the combined switching device according to the fourth embodiment to the TO-type package. Increases in on-current and on-voltage were limited to 50 A/cm$^2$ and 0.2 V or less, respectively, in a 1000-hour energization test. Therefore, in the combined switching device according to the fourth embodiment, no significant reduction in reliability was confirmed due to an increase in stacking faults etc., occurring in the epitaxial layers making up the combined switching device.

As described above, according to the fourth embodiment, the same effects as the first embodiment can be acquired.

(Fifth Embodiment)

A semiconductor device according to a fifth embodiment is a combined switching device having a 24-kV class breakdown voltage, for example, and having a plurality of elements formed on the same SiC substrate made of 4H—SiC. The combined switching device according to the fifth embodiment has an FS-IGBT (Field Stop IGBT) disposed in the IGBT area instead of the IGBT of the combined switching device according to the first embodiment.

The FS-IGBT is configured such that two functions of an n-buffer layer, i.e., a field stop function of stopping the extension of the depletion layer and a function of suppressing the carrier injection from the $P^+$-collector layer, are divided to leave only the field stop function of stopping the extension of the depletion layer in the n-buffer layer. The function of suppressing the carrier injection from the $P^+$-collector layer is achieved by making the impurity concentration of the $p^+$-collector layer considerably lower than the impurity concentration of a punch-through type IGBT. By making the impurity concentration of the $p^+$-collector layer considerably lower, a large part of electrons injected from the n-buffer layer into the $p^+$-collector layer reaches the collector electrode. The $p^+$-collector layer of the fifth embodiment is a so-called transparent collector (hereinafter, a transparent $p^+$-collector layer).

By lowering the concentration in the $p^+$-collector layer to suppress the injection of carriers, a problem caused by the excessive injection of carriers from the $p^+$-collector layer side can be suppressed. Therefore, the carrier lifetime control becomes unnecessary that is normally used for suppressing the excessive injection of carriers from the $p^+$-collector layer side. The problem caused by the excessive injection of carriers from the $p^+$-collector layer side is a significant increase in a turn-off loss because a turn-off time is elongated due to excessive carriers remaining at the time of turn-off of the FS-IGBT.

The lifetime control is generally provided by subjecting the elements to electron beam irradiation, particle beam irradiation such as proton and helium, or doping of heavy metal, and various crystal defects are formed in the SiC substrate due to the lifetime control. Therefore, problems such as an increase in a leak current and deterioration of a forward voltage during ON-state may also occur. Therefore, since the lifetime control becomes unnecessary, the problems such as an increase in a leak current and deterioration of a forward voltage during ON-state can be avoided.

In the combined switching device according to the fifth embodiment, the $n^-$-drift layer is a nitrogen-doped epitaxial layer. The thickness and the impurity concentration of the $n^-$-drift layer may be, for example, about 230 µm and about $9 \times 10^{13}$ cm$^{-3}$, respectively. The n-buffer layer is a nitrogen-doped epitaxial layer. The thickness and the impurity concentration of the n-buffer layer may be, for example, about 8 µm and about $3 \times 10^{17}$ cm$^{-3}$, respectively. The impurity concentration of the n-buffer is low for a high breakdown voltage. The $p^+$-collector layer is formed by ion implantation using Al as a dopant, for example. The thickness of the $p^+$-collector layer may be about 0.5 µm, for example. The impurity concentration of the $p^+$-collector layer is about $8 \times 10^{17}$ cm$^{-3}$, which is lower than that of a punch-through type IGBT.

To realize a 24-kv class high breakdown voltage in the combined switching device according to the fifth embodiment, a width between adjacent body layers and a width of a JTE are set larger. For example, the JTE may have a two-zone structure and the total width of the JTE may be 800 µm. For example, the width and the impurity concentration of the JTE disposed on the $n^+$-channel stopper side may be 350 µm and about $1.8 \times 10^{17}$ cm$^{-3}$, respectively. The width and the impurity concentration of the JTE disposed on the mesa portion side may be 450 µm and about $3.6 \times 10^{17}$ cm$^{-3}$, respectively.

The cross-sectional structures and the planar layout of the MOSFET cells, the FS-IGBT cells, the JTE, and the re-channel stopper of the combined switching device according to the fifth embodiment are the same as the cross-sectional structures and the planar layout of the MOSFET cells, the IGBT cells, the JTE, and the n-channel stopper of the combined switching device according to the first embodiment.

In the combined switching device according to the fifth embodiment, the thickness of the $n^-$-drift layer making up the SiC substrate is increased to, for example, about 230 µm so as to realize a 24-kV high breakdown voltage. If an overall thickness of about 250 µm is ensured for elements so as to prevent damages during wafer handling as much as possible, the SiC support substrate can be formed as a thinner plate until the thickness of the SiC support substrate acting as the n-drain layer reaches about 20 µm. As a result, a depth of anisotropic etching of a concave portion necessary for forming a $p^+$-collector layer of an FS-IGBT cell can be set to about 20 µm.

If the depth of the concave portion formed by the anisotropic etching is 50 µm, a mask for etching may deteriorate during one etching and, therefore, the mask may have to be formed again to perform the anisotropic etching in a plurality of steps. Therefore, because of the shallow depth of etching for forming a concave portion on the second principal surface of the SiC support substrate, the fabricating operation of the combined switching device can significantly be simplified.

The operation and representative characteristics of the combined switching device according to the fifth embodiment will be described. First, as is the case with the first embodiment, after the combined switching device according to the fifth embodiment was mounted on a TO-type package, a gate voltage of 20 V was applied to measure the forward output characteristics of the combined switching device. As is the case with the first embodiment, an on-current started flowing through the combined switching device approximately when a voltage Vce applied between a collector and an emitter reached near zero V.

By further increasing the voltage Vce applied between the collector and the emitter, the on-current of the combined switching device substantially linearly increased, and the on-current started drastically increasing approximately when the voltage Vce applied between the collector and the emitter reached near 2.7 V. This is because the MOSFET is turned on at the forward applied voltage near zero V and the FS-IGBT is subsequently turned on at the forward applied voltage near 2.7 V, thereby causing the on-current flowing due to the MOSFET and the on-current flowing due to the FS-IGBT to flow in a superimposed manner.

In the combined switching device according to the fifth embodiment, the on-resistance per unit area was about 890 mΩ-cm$^2$ when the applied voltage was less than or equal to the FS-IGBT built-in voltage, and the on-resistance per unit area was about 67 mΩ-cm$^2$ when the applied voltage was greater than or equal to the FS-IGBT built-in voltage, which is extremely favorable. Since the output can be extracted with the forward voltage less than or equal to the FS-IGBT built-in voltage in this way, an electric power loss can be reduced.

In the combined switching device according to the fifth embodiment, the forward voltage was applied between the collector electrode, and the source electrode and the emitter electrodes while the gate voltage was not applied. Although a leak current flowed in this case, the combined switching device exhibited favorable forward blocking characteristics and caused avalanche breakdown at the forward voltage near 24.8 kV at room temperature.

The leak current until at the forward voltage of 20 kV was less than or equal to $2\times10^{-3}$ A/cm$^2$ at room temperature, which was favorable. The turn-on time and the turn-off time of the combined switching device are 420 ns and 760 ns, respectively, and the high-speed operation of the combined switching device can be realized. An increase in the on-voltage was limited to 0.3 V or less in a 1000-hour energization test and no significant decrease in reliability was recognized in the combined switching devices.

As described above, according to the fifth embodiment, the same effects as the first embodiment can be acquired.

Sixth Embodiment

Figure 10:
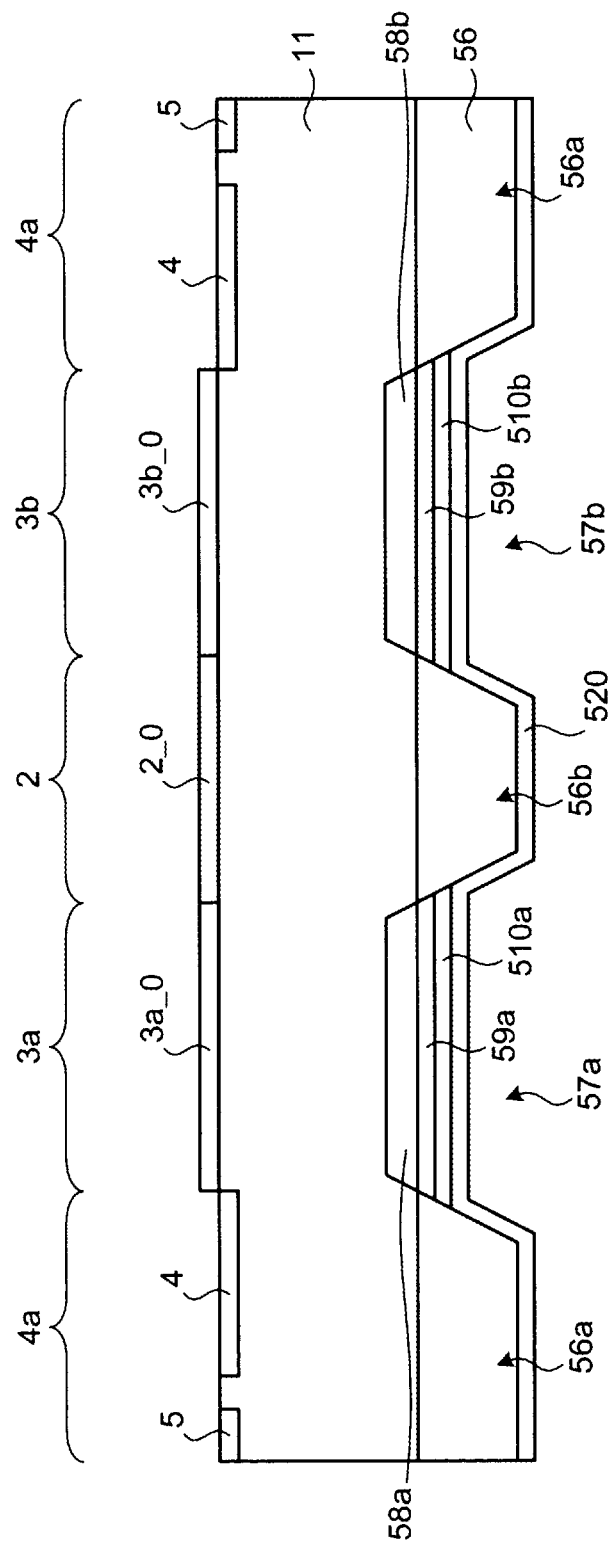
FIG. 10 is a cross-sectional view of a semiconductor device according to a sixth embodiment.

FIG. 10 is a cross-sectional view of a semiconductor device according to a sixth embodiment. The semiconductor device depicted in FIG. 10 is a combined switching device having, for example, a 9-kV class breakdown voltage made up of a plurality of elements formed on the same SiC substrate made of 4H—SiC. The combined switching device according to the sixth embodiment is different from the combined switching device according to the fifth embodiment in that n-buffer layers (hereinafter, n-field stop layers) $58a$ and $58b$ having only the field stop function of the fifth embodiment are formed only in the IGBT areas $3a$ and $3b$ and are not formed in the MOSFET area 2 and that the n-field stop layers $58a$ and $58b$ are formed by ion implantation.

As is the case with the fifth embodiment, the IGBT areas $3a$ and $3b$ are disposed with FS-IGBTs formed by connecting a plurality of FS-IGBT cells in parallel. For example, as depicted in FIG. 10, concave portions $57a$ and $57b$ are disposed with a depth reaching the n$^-$-drift layer 11, for example. The n-field stop layers $58a$ and $58b$ are disposed only on the surface layer of the n$^-$-drift layer 11 exposed on the bottom surfaces of the concave portions $57a$ and $57b$. The n-field stop layers $58a$ and $58b$ are not disposed in the MOSFET area 2. In the MOSFET area 2, an n$^+$-drain layer 56 consisting of the SiC support substrate functions as an n-field stop layer.

Transparent p$^+$-collector layers $59a$ and $59b$ of the FS-IGBT cells are formed on the surface layers of the n-field stop layers $58a$ and $58b$, respectively. The end portions and the n$^-$-drift layer 11 side of the transparent p$^+$-collector layers $59a$ and $59b$ are surrounded by the n-field stop layers $58a$ and $58b$. Ti films $510a$ and $510b$ are formed on the surfaces of the transparent p$^+$-collector layers $59a$ and $59b$ as is the case with the first embodiment. The top surface element structures $3a\_0$ and $3b\_0$ of the FS-IGBT cells are the same as the IGBT cells of the first embodiment. The cross-sectional structure of the MOSFET cells is the same as the MOSFET cells of the first embodiment.

The planar layout of the MOSFET area 2, the IGBT areas $3a$ and $3b$, the JET 4, and the n-channel stopper 5 of the combined switching device according to the sixth embodiment is the same as the combined switching device according to the first embodiment. The impurity concentrations and the dimensions of the areas of the MOSFET cells and the FS-IGBT cells of the combined switching device according to the sixth embodiment are substantially the same as the combined switching device according to the first embodiment.

A fabricating method of the combined switching device 1 according to the sixth embodiment will be described. First, as is the case with the first embodiment, an n-type SiC support substrate acting as the n$^+$-drain layer 56 is prepared. The n$^-$-drift layer 11 is epitaxially grown on the first principal surface of the SiC support substrate as is the case with the first embodiment. In the sixth embodiment, the SiC substrate is a substrate formed by stacking the SiC support substrate acting as the n$^+$-drain layer 56, the n-field stop layers $58a$ and $58b$ formed on the n$^-$-drift layer 11 at a subsequent operation, and the n$^-$-drift layer 11 epitaxially grown on the SiC support substrate surface.

Operations are performed from the operation of forming the resistance reduction layer, the p-body layers, the n$^+$-source layers, and the n$^+$-emitter layers of the top surface element structure $2\_0$ of the MOSFET cells and the top surface element structures $3a\_0$ and $3b\_0$ of the FS-IGBT cells on the first principal surface side (the n$^-$-drift layer 11 side) of the SiC substrate, to the operation of forming the concave portions $57a$ and $57b$ on the second principal surface side (the n$^+$-drain layer 56 side) of the SiC substrate, as is the case with the first embodiment.

The n-field stop layers $58a$ and $58b$ of the FS-IGBT cells are formed by ion implantation on the bottom surface of the n$^+$-drain layer 56 exposed in the concave portions $57a$ and $57b$. The thickness and the impurity concentration of the n-field stop layers $58a$ and $58b$ may be about 0.85 μm and about $4\times10^{17}$ cm$^{-3}$, respectively. The dopant of the ion implantation forming the n-field stop layers $58a$ and $58b$ may be nitrogen, for example.

Because of the ion implantation into the bottom surfaces of the concave portions $57a$ and $57b$ for forming the n-field stop layers $58a$ and $58b$, nitrogen is ion-implanted at the same time into the side walls of the concave portions $57a$ and $57b$ and the n$^+$-drain layer 56 of convex portions $56a$ and $56b$. However, since nitrogen implanted into the n$^+$-drain layer 56 has the same conductivity type as the n$^+$-drain layer 56, the electric characteristics of the combined switching device are not changed by the ion implantation of nitrogen into the n$^+$-drain layer 56.

The second principal surface of the SiC substrate is entirely covered by a protection film from the surfaces of the convex portions $56a$ and $56b$ to the side walls and the bottom surfaces of the concave portions $57a$ and $57b$. Photolithography is used to remove the portions of the protection film covering the bottom surfaces of the concave portions $57a$ and $57b$, i.e., the formation areas of the transparent p$^+$-collector layers $59a$ and $59b$. As a result, the protection film having openings only in the formation areas of the transparent p$^+$-collector layers $59a$ and $59b$ is left on the second principal surface of the SiC substrate.

Ion implantation is performed for forming the transparent p$^+$-collector layers $59a$ and $59b$ on the n$^-$-drift layer 11 exposed on the bottom surfaces of the concave portions $57a$ and $57b$. The dopant of the ion implantation for forming the transparent p$^+$-collector layers $59a$ and $59b$ may be Al, for example. The thickness and the impurity concentration of the transparent p$^+$-collector layers $59a$ and $59b$ may be about 0.25 μm and about $1.1\times10^{18}$ cm$^{-3}$, respectively. An annealing treatment is performed in a known method to form the transparent p$^+$-collector layers $59a$ and $59b$ on the surface layer of the n$^-$-drift layer 11 exposed on the bottom surfaces of the concave portions $57a$ and $57b$.

The transparent p$^+$-collector layers $59a$ and $59b$ formed in this way are preferably surrounded by the n-field stop layers $58a$ and $58b$ except the ion-implanted surface on the second primary surface side of the SiC substrate.

In the top surface element structure 2 of the MOSFET cells and the top surface element structures $2\_0$, $3a\_0$, and $3b\_0$ of the FS-IGBT cells, gate insulating films, gate electrodes, source electrodes, emitter electrodes, and passivation films not yet formed are formed as is the case with the first embodiment.

The Ti films 510a and 510b are formed on the surfaces of the transparent p+-collector layers 59a and 59b in a known method. The Ti films 510a and 510b form ohmic contacts with the transparent p+-collector layers 59a and 59b. An Ni film (not depicted) functioning as contact metal of the n+-drain layer 56 is formed on the surface of the n+-drain layer 56 consisting of the convex portion 56b. The Ni film forms an ohmic contact with the n+-drain layer 56.

The Ni film may be formed from the convex portion 56b across the side walls of the concave portions 57a and 57b or may be formed from the convex portion 56b across the bottom surfaces of the concave portions 57a and 57b. An AU film with a thickness of about 4 μm, for example, is formed entirely on the second principal surface of the SiC substrate including the surface of the Ni film with the ohmic contact formed, i.e., entirely on the second principal surface of the SiC support substrate, to form a collector electrode 520 consisting of the Ni film and the Au film. The collector electrode 520 formed on the surface of the convex portion 56b functions as a drain electrode of the MOSFET.

The operation and representative characteristics of the combined switching device according to the sixth embodiment will be described. First, as is the case with the first embodiment, after the combined switching device according to the sixth embodiment was mounted on a TO-type package, a gate voltage of 20 V was applied to measure the forward output characteristics. As is the case with the first embodiment, an on-current started flowing through the combined switching device approximately when the voltage Vce applied between the collector and the emitter reached near zero V.

By further increasing the voltage Vce applied between the collector and the emitter, the on-current of the combined switching device substantially linearly increased, and the on-current started drastically increasing approximately when the voltage Vce applied between the collector and the emitter reached near 2.7 V, which is the FS-IGBT built-in voltage. This is because the MOSFET is turned on at the forward applied voltage near zero V and the FS-IGBT is subsequently turned on at the forward applied voltage near 2.7 V, thereby causing the on-current flowing due to the MOSFET and the on-current flowing due to the FS-IGBT to flow in a superimposed manner.

In the combined switching device according to the sixth embodiment, the on-resistance per unit area was about 151 mΩ-cm² when the applied voltage was less than or equal to the FS-IGBT built-in voltage, and the on-resistance per unit area was about 27 mΩ-cm² when the applied voltage was greater than or equal to the FS-IGBT built-in voltage, which is extremely favorable. Since the output can be extracted with the forward voltage less than or equal to the FS-IGBT built-in voltage in this way, an electric power loss can significantly be reduced.

In the combined switching device according to the sixth embodiment, the forward voltage was applied between the collector electrode, and the source electrode and the emitter electrodes while the gate voltage was not applied. Although a leak current flowed in this case, the combined switching device exhibited favorable forward blocking characteristics and caused avalanche breakdown at the forward voltage near 9.1 kV at room temperature. The turn-on time and the turn-off time of the combined switching device are 240 ns and 420 ns, respectively, and the high-speed operation of the combined switching device can be realized. An increase in the on-voltage was limited to 0.3 V or less in a 1000-hour energization test and no significant decrease in reliability was recognized in the combined switching devices.

As described above, according to the sixth embodiment, the same effects as the first embodiment can be acquired.

The present invention is not limited to the embodiments described above and can variously be changed. For example, impurity concentration and thickness may variously be changed in the areas of the MOSFET cells and the IGBT cells to configure a combined switching device having a higher breakdown voltage of 25-kV class or 50-kV class. If a breakdown voltage of a combined switching device is set higher, a depletion layer must be expanded to reduce an electric field and an n⁻-drift layer is formed thicker. Since the n⁻-drift layer making up the SiC substrate is formed thicker, the processing depth of the etching forming a concave portion can correspondingly be made thinner on the second principal surface side (the n-drain layer side) of the SiC substrate, i.e., in the second principal surface of the SiC support substrate, and the combined switching device can easily be fabricated.

Although the electric field relaxation layer is a JTE in this description, the same effect can be acquired by disposing other electric field relaxation layers such as an field limiting ring (FLR) and a RESURF instead of the JTE, or a JTE consisting of a plurality of areas having different impurity concentrations. The planar shapes of the MOSFET cells and the IGBT cells can variously be changed. The planar shapes and the area ratios of the unipolar transistor and the bipolar transistor can be changed for optimization in accordance with the specifications of the combined switching device.

The numbers of the concave portions and the convex portions disposed on the second principal surface of the SiC support substrate are not limited to one to three described in the embodiments and can variously be increased or decreased. Although SiC is used as the wide-gap semiconductor material in this description, other wide-gap semiconductor materials such as GaN and diamond may be used or a wide-gap semiconductor material may be used that has a heterojunction structure made up of a plurality of different wide-gap semiconductors and, for example, a wide-gap semiconductor material may be used that has a heterojunction structure using SiC as the support substrate with the SiC substrate replaced with GaN. The Ni film functioning as contact metal of the n+-drain layer of the MOSFET cell may be formed only on the surface of the convex portion or may be formed from the surface of the convex portion across the side walls of the concave portions.

Industrial Applicability

As described above, the semiconductor device according to the present invention is applicable to a high-performance combined switching device having a high breakdown voltage. The semiconductor device can be applied and developed in the case of a wide-gap semiconductor material making the formation of a highly-concentrated n-substrate difficult. The semiconductor device can be utilized for a high-breakdown-voltage inverter etc., directly connected to a distribution system. In this case, a transformer can be removed, thereby enabling the significant reduction in size and weight and the energy saving of a system. The semiconductor device is available not only for a current distribution system but also for a smart grid, which is a next-generation system network. The semiconductor device is also available for a control device of industrial equipment such as a large fan, a pump, and a rolling mill.

EXPLANATIONS OF LETTERS OR NUMERALS 1, 221 combined switching device
2, 222 MOSFET (unipolar transistor) area
2_0 MOSFET top surface element structure 3a, 3b, 223 IGBT (bipolar transistor) area
3a_0, 3b_0 IGBT top surface element structure
3b_1, 3b_2 IGBT cell
4, 224 JTE
5, 225 n-channel stopper
6, 36, 46 n-drain layer
6a, 6b, 56a, 56b convex portion
7a, 7b, 57a, 57b concave portion
8, 38, 48 n-buffer layer
58a, 58b n-field stop layer
9a, 9b, 39, 49, 59a, 59b p$^+$-collector layer
23a, 23b, 313a, 413a n$^+$-emitter layer
10a, 10b, 40, 50, 510a, 510b Ti film
11, 311, 411, 511 n$^-$-drift layer
12, 22a, 22b p-body layer
13, 313b, 413b n$^+$-source layer
14, 24a, 24b p$^+$-contact layer
15, 315b, 415b source electrode
16a, 16b, 26a, 26b gate insulating film
17a, 17b, 27a, 27b, 317a, 317b, 417a, 417b gate electrode (first gate electrode)
20, 320, 420, 520 collector electrode (drain electrode)
20a, 320a, 420a Ni film
20b, 320b, 420b Au film
25a, 25b, 315a, 415a emitter electrode
316a, 316b, 416a, 416b p-junction gate layer
321a, 321b channel
422a, 422b p-buried gate layer
423a, 423b second gate electrode

The invention claimed is
1. A semiconductor device having at least one or more bipolar transistors and at least one or more unipolar transistors disposed on a semiconductor substrate of a first conductivity type and made of a semiconductor material with a band gap larger than silicon, the semiconductor device comprising:
a first semiconductor layer of the first conductivity type and constituting the semiconductor substrate on a first principal surface side of the semiconductor substrate;
a second semiconductor layer of the first conductivity type and constituting the semiconductor substrate on a second principal surface side of the semiconductor substrate, the second semiconductor layer having an impurity concentration higher than the first semiconductor layer;
a third semiconductor layer of the first conductivity type disposed between the first semiconductor layer and the second semiconductor layer to be in contact with at least the first semiconductor layer;
a concave portion disposed on the second principal surface side of the semiconductor substrate and penetrating the second semiconductor layer to the third semiconductor layer;
a fourth semiconductor layer of a second conductivity type and disposed on a bottom surface of the concave portion to be in contact with the third semiconductor layer;
an output electrode of the bipolar transistor, contacting the fourth semiconductor layer; an input electrode and a control electrode of the bipolar transistor disposed on the first principal surface side of the semiconductor substrate at a position corresponding to the concave portion;
a convex portion formed on the second principal surface side of the semiconductor substrate, correspondingly to the concave portion; an output electrode of the unipolar transistor disposed on a surface of the convex portion to be electrically connected to the output electrode of the bipolar transistor;
an input electrode of the unipolar transistor disposed on the first principal surface side of the semiconductor device at a position corresponding to the convex portion to be electrically connected to the input electrode of the bipolar transistor; and
a control electrode of the unipolar transistor disposed on the first principal surface side of the semiconductor device at a position corresponding to the convex portion to be electrically connected to the control electrode of the bipolar transistor.

2. The semiconductor device of claim 1, wherein the unipolar transistor and the bipolar transistor are electrically connected in parallel.

3. The semiconductor device of claim 1, wherein
a plurality of the concave portions of the semiconductor substrate is disposed,
the bipolar transistor is disposed at each of the positions corresponding to the concave portions of the semiconductor substrate, and the input electrodes,
the output electrodes, and the control electrodes of the bipolar transistors are respectively electrically connected.

4. The semiconductor device of claim 1, wherein
a plurality of the convex portions of the semiconductor substrate is disposed,
the unipolar transistor is disposed at each of the positions corresponding to the convex portions of the semiconductor substrate, and
the input electrodes, the output electrodes, and the control electrodes of the unipolar transistors are respectively electrically connected.

5. The semiconductor device of claim 1, wherein
the bipolar transistor is formed by a plurality of bipolar transistor cells, and
input electrodes, output electrodes, and control electrodes of the bipolar transistor cells are respectively electrically connected.

6. The semiconductor device of claim 1, wherein
the unipolar transistor is formed by a plurality of unipolar transistor cells, and
input electrodes, output electrodes, and control electrodes of the unipolar transistor cells are respectively electrically connected.

7. The semiconductor device of claim 1, further comprising
a fifth semiconductor layer of the second conductivity type of the bipolar transistor selectively disposed on a surface layer of the first semiconductor layer at a position corresponding to the concave portion; and
a sixth semiconductor layer of the first conductivity type of the bipolar transistor selectively disposed on a surface layer of the fifth semiconductor layer, wherein
the input electrode of the bipolar transistor is in contact with the sixth semiconductor layer.

8. The semiconductor device of claim 1, further comprising
a seventh semiconductor layer of the second conductivity type of the unipolar transistor selectively disposed on a surface layer of the first semiconductor layer at a position corresponding to the convex portion; and
an eighth semiconductor layer of the first conductivity type of the unipolar transistor selectively disposed on a surface layer of the seventh semiconductor layer, wherein
the input electrode of the unipolar transistor is in contact with the eighth semiconductor layer.

9. The semiconductor device of claim 1, wherein
the bipolar transistor has an insulation gate structure with a gate insulating film disposed to be in contact with the semiconductor substrate between the semiconductor substrate and the control electrode of the bipolar transistor, and the unipolar transistor has an insulation gate structure with a gate insulating film disposed to be in contact with the semiconductor substrate, between the semiconductor substrate and the control electrode of the unipolar transistor.

10. The semiconductor device of claim 1, further comprising:
   a sixth semiconductor layer of the first conductivity type of the bipolar transistor selectively disposed on a surface layer of the first semiconductor layer at a position corresponding to the concave portion;
   a ninth semiconductor layer of the second conductivity type of the bipolar transistor selectively disposed away from the sixth semiconductor layer on the surface layer of the first semiconductor layer at the position corresponding to the concave portion;
   an eighth semiconductor layer of the first conductivity type of the unipolar transistor selectively disposed on the surface layer of the first semiconductor layer at a position corresponding to the convex portion; and
   a tenth semiconductor layer of the second conductivity type of the unipolar transistor selectively disposed away from the eighth semiconductor layer on the surface layer of the first semiconductor layer, at the position corresponding to the convex portion, wherein the bipolar transistor has a gate structure with the control electrode of the bipolar transistor disposed to be in contact with the ninth semiconductor layer, and the unipolar transistor has a gate structure with the control electrode of the unipolar transistor disposed to be in contact with the tenth semiconductor layer.

11. The semiconductor device of claim 1, wherein
the fourth semiconductor layer is an epitaxial layer grown on a surface of the third semiconductor layer exposed on the bottom surface of the concave portion.

12. The semiconductor device of claim 1, wherein
the fourth semiconductor layer is a semiconductor layer formed by implanting the second conductivity type impurity into the third semiconductor layer exposed on the bottom surface of the concave portion.

13. The semiconductor device of claim 1, further comprising
an electric field relaxation layer surrounding the bipolar transistor and the unipolar transistor.

14. The semiconductor device of claim 13, wherein the electric field relaxation layer is disposed on the semiconductor substrate at a position corresponding to a convex portion disposed on an outer peripheral portion.

15. The semiconductor device of claim 1, wherein
the third semiconductor layer is in contact with the second semiconductor layer.

* * * * *